United States Patent
Bagheri et al.

(10) Patent No.: US 7,263,342 B2
(45) Date of Patent: Aug. 28, 2007

(54) HIGH FREQUENCY WIRELESS RECEIVER CIRCUITS AND METHODS

(75) Inventors: Rahim Bagheri, Los Angeles, CA (US); Masoud Djafari, Marina Del Ray, CA (US); Mahnaz Atri, Los Angeles, CA (US)

(73) Assignee: WiLinx, Inc., Los Angeles, CA (US)

( * ) Notice: Subject to any disclaimer, the term of this patent is extended or adjusted under 35 U.S.C. 154(b) by 249 days.

(21) Appl. No.: 10/929,206

(22) Filed: Aug. 30, 2004

(65) Prior Publication Data

US 2006/0046681 A1    Mar. 2, 2006

(51) Int. Cl.
*H04B 1/10* (2006.01)
(52) U.S. Cl. .................. 455/283; 455/296
(58) Field of Classification Search ........... 455/232.1, 455/234.1, 234.2, 280, 283, 296, 311; 333/32; 327/103
See application file for complete search history.

(56) References Cited

U.S. PATENT DOCUMENTS

| | | | |
|---|---|---|---|
| 5,162,754 A | 11/1992 | Soares et al. | |
| 5,404,050 A | 4/1995 | Nauta | |
| 5,574,405 A | 11/1996 | Razavi | |
| 6,008,696 A | 12/1999 | Smith | |
| 6,122,491 A | 9/2000 | Francisco | |
| 6,134,427 A | 10/2000 | Hughes | |
| 6,208,446 B1 * | 3/2001 | Faifman | 398/136 |
| 6,288,609 B1 | 9/2001 | Brueske et al. | |
| 6,366,171 B1 | 4/2002 | Litmanen et al. | |
| 6,366,622 B1 | 4/2002 | Brown et al. | |
| 6,417,737 B1 | 7/2002 | Moloudi et al. | |
| 6,476,676 B1 * | 11/2002 | Tanaka et al. | 330/258 |
| 6,556,085 B2 | 4/2003 | Kwon et al. | |
| 6,586,993 B2 | 7/2003 | Macedo | |
| 6,600,371 B2 | 7/2003 | Cali | |
| 6,624,699 B2 | 9/2003 | Yin et al. | |
| 6,628,170 B2 | 9/2003 | Titus | |
| 6,639,468 B2 | 10/2003 | Belot | |
| 6,667,649 B1 | 12/2003 | Lee | |
| 6,667,666 B2 | 12/2003 | Uzunoglu | |
| 6,754,478 B1 | 6/2004 | Lee et al. | |

(Continued)

OTHER PUBLICATIONS

Ren-Chieh Liu et al, "A 0.6-2.2-GHz Broadband CMOS Distributed Amplifier", IEEE Radio Frequency Integrated Circuits Symposium, 2003, pp. 103-106.

(Continued)

*Primary Examiner*—Nguyen T. Vo
(74) *Attorney, Agent, or Firm*—Fountainhead Law Group PC; Chad P. Walsh

(57) ABSTRACT

Embodiments of the present invention include circuits for use in wireless receivers that provide wide band matching with improved gain and noise performance. In one embodiment, the present invention includes a wireless receiver comprising an antenna, a first transistor having a source coupled to the antenna, a second transistor having a gate coupled to the antenna and a network comprising a first terminal coupled to the antenna, a second terminal coupled to the source of the first transistor and a third terminal coupled to the gate of the second transistor, wherein the network has a transimpedance between the second and third terminals so that noise generated by the first transistor is differentially rejected by the system across a predetermined range of frequencies.

29 Claims, 18 Drawing Sheets

U.S. PATENT DOCUMENTS

| | | |
|---|---|---|
| 6,781,467 B2 | 8/2004 | Sun |
| 6,841,771 B2* | 1/2005 | Shimizu ................. 250/214 A |
| 2004/0192230 A1 | 9/2004 | Franca-Neto |
| 2005/0062543 A1* | 3/2005 | Mayampurath et al. ..... 330/308 |

OTHER PUBLICATIONS

Brian M. Ballweber et al, "A Fully Integrated 0.5-5.5-GHz CMOS Distributed Amplifier", IEEE Transactions on Solid-State Circuits, Feb. 2000, pp. 231-239, vol. 35, No. 2.

Andrea Bevilacqua et al., "An Ultra-Wideband CMOS LNA for 3.1 to 10.6GHz Wireless Receivers", IEEE International Solid-State Circuits Conference, 2004.

Herbert Knapp et al., "15 GHz Wideband Amplifier with 2.8 dB Noise Figure in SiGe Bipolar Technology", IEEE Radio Frequency Integrated Circuits Symposium, 2001, pp. 287-290.

F. Bruccoleri et al., "Noise Cancelling in Wideband CMOS LNAs", IEEE International Solid-State Circuits Conference, Feb. 5, 2002.

Federico Bruccoleri et al., "Generating All Two-MOS-Transistor Amplifiers Leads to New Wide-Band LNAs", IEEE Journal of Solid-State Circuits, Jul. 2001, vol. 36, No. 7.

Stefan Andersson et al, "Wideband LNA for a Multistandard Wireless Receiver in 0.18 μm CMOS", IEEE Solid-State Circuits Conference, Sep. 16, 2003, pp. 655-658.

A. Ismail et al., "A 3 to 10GHz LNA Using a Wideband LC-ladder Matching Network", IEEE International Solid-State Circuits Conference, Feb. 18, 2004.

Federico Bruccoleri et al., "Wide-Band CMOS Low-Noise Amplifier Exploiting Thermal Noise Canceling", IEEE Journal of Solid State Circuits, Feb. 2004, vol. 39, No. 2.

* cited by examiner

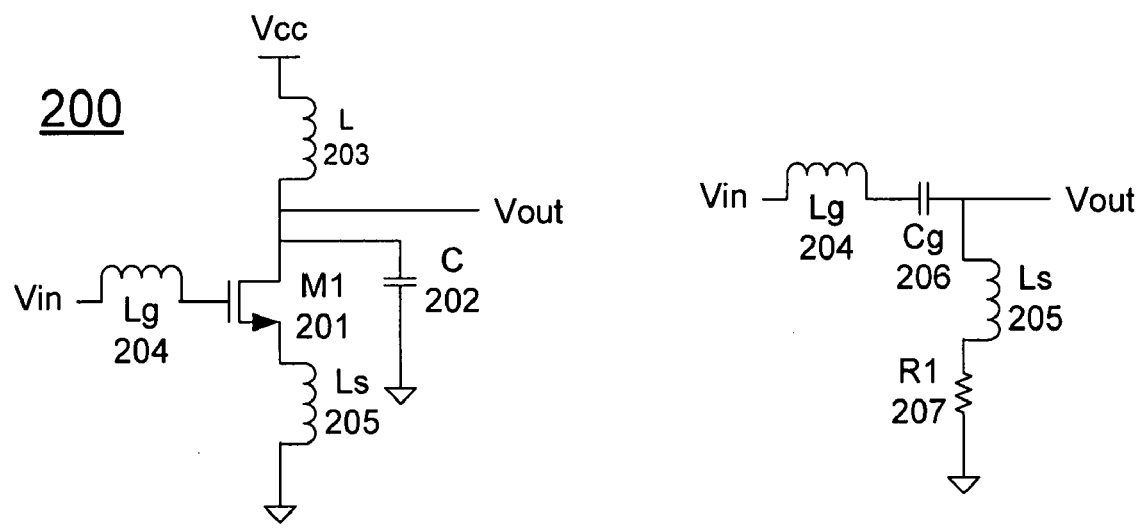
Fig. 2A
(Prior Art)
Fig. 2B
(Prior Art)
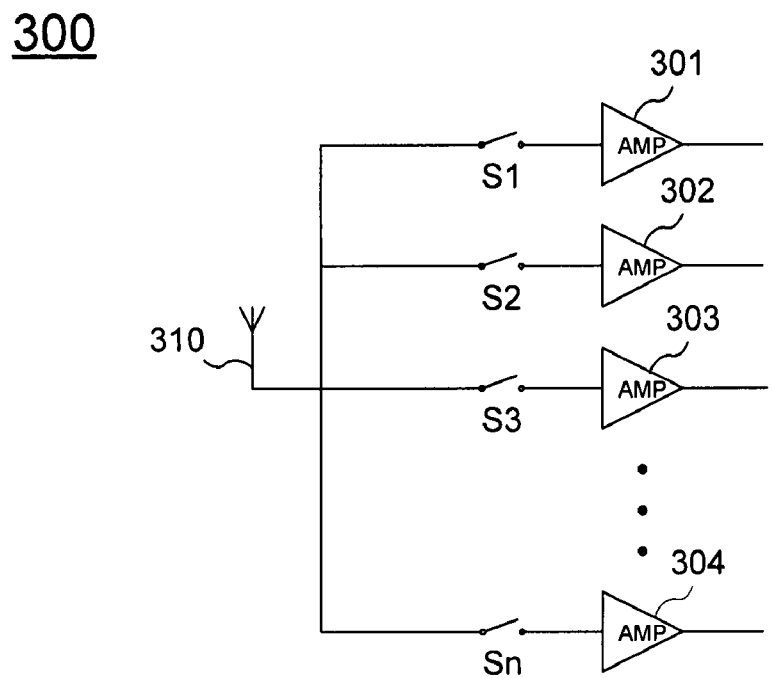
Fig. 3
(Prior Art)

400

500

HIGH FREQUENCY WIRELESS RECEIVER CIRCUITS AND METHODS

BACKGROUND

The present invention relates to electronic circuits, and in particular, to circuits and methods that can be used to receive high frequency input signals.

Traditionally, the overwhelming majority of electronic systems have been connected together using various types of wires or cables. For example, computer systems are typically linked by Ethernet cables, coaxial cables, telephone lines or fiber optic links. Similarly, computer printers, scanners and other peripheral devices such as digital cameras, personal digital assistants or electronic music devices are linked by various types of wires or cables. Other types of electronic devices are similarly connected together using some form of wiring or cabling. However, as electronic systems become more prevalent, there is a growing desire to eliminate the clutter and confusion of the associated wiring.

Wireless technology offers a solution to this growing problem. In a wireless system, electronic devices and systems communicate with each other using electromagnetic signals that propagate through the air. Wireless communication is typically achieved by encoding information in an electronic signal, and then transmitting the signal into the air using an antenna. FIG. 1A illustrates a simplified wireless channel. First, a signal of interest, such as a voice signal or a data signal, is encoded using an encoder 101 in transmitter 110. The encoded signal may then be modulated up to a higher frequency using a modulator 102. After modulation, the encoded voice or data signal is contained within a frequency range centered on the frequency of the modulator as shown in FIG. 1B. The modulator's frequency is sometimes referred to as a "carrier frequency" or "channel frequency," which may be a very high frequency suited for electromagnetic transmission. Such high frequency signals are referred to as radio frequency (i.e., "RF") signals because of their historical use in radio transmission systems. A power amplifier 103 receives the modulated signal and drives an antenna 104. Power amplifier 103 must be fast enough to amplify signals at frequencies around the carrier frequency. This means that power amplifier 103 must have the requisite "bandwidth" to process the signal (i.e., the ability to effectively amplify signals across the entire frequency range of interest). The amplified signals drive the antenna, which translates the encoded modulated signal into electromagnetic energy that propagates through the air.

A second antenna 121 in receiver 120 may be used to detect (i.e., sense) the electromagnetic signal. Receiver 120 includes an amplifier 122 that may be used for increasing the amplitude of the signal received on antenna 121. Because electromagnetic transmissions typically decrease in strength rapidly as the distance between transmitter 110 and receiver 120 increases, amplifier 122 must be able to detect signals that may vary across a wide amplitude range as the distance between transmitter 110 and receiver 120 varies. Additionally, when receiver 120 is far away from transmitter 110, the electromagnetic signals can be very small (e.g., microwatts). Thus, receiver 120 must be able to amplify very small signals without introducing noise. Moreover, similar to power amplifier 103, amplifier 122 must be fast enough to amplify signals at frequencies around the carrier frequency. After the encoded modulated signals is amplified, demodulator 123 may be used to down-convert the signal's frequency, and decoder 124 may be used to extract the original voice or data signal. Since communication is typically a two-way process, most wireless systems will include both a transmitter 110 and a receiver 120 coupled to an antenna.

While wireless technology has successfully been used to implement such systems as radio, analog television and cellular telephone systems, it has one major limitation—data rate. Over the last decade, the number of electronic devices has increased drastically. Furthermore, the information capacity of each device has similarly increased. Thus, the amount of data that must be communicated between modern electronic devices has become enormous. Wired systems are advantageous because communication channels between devices are confined to the wires that connect them. These separate wires all represent separate communication medium. Wireless devices, on the other hand, all share the same communication medium—the airwaves. Consequently, wireless devices typically communicate with each other across predefined frequency ranges (i.e., channels).

For wireless devices to replace existing wired connections, more effective frequency allocations are required to handle the large amount of information that is transmitted and received between various types of electronic systems. This is typically achieved by moving to much higher frequencies than have been used in the past. In particular, while frequencies in the megahertz range ("MHz") have been commonplace in the past, frequencies in the gigahertz range (e.g., above 2 GHz) may be used for larger data rates. For example, a 10 GHz range may be divided up into a plurality of individual 500 MHz wide subranges (i.e., subbands), each of which may be used as a channel to carry information. Thus, for a wireless system to maximize the data rate, it should be able to operate effectively across a wide range of frequencies (e.g., 3 GHz-10 GHz). Consequently, what is needed is a receiver that can operate across a wide range so that a single system can receive multiple frequency channels across the gigahertz range.

Contemporary receivers suffer from a variety of shortcomings. FIG. 2A illustrates a simplified prior art receiver amplifier 200. Amplifier 200 includes an MOS transistor 201 having a gate coupled through an inductor 204 ("Lg") to receive an RF input signal ("Vin"), a source coupled through an inductor 205 ("Ls") to ground and a drain coupled to a capacitor ("C") 202 and an inductor ("L") 203. Capacitor 202 is coupled to ground and inductor 203 is coupled to a supply ("Vcc"). Amplifier 200 is effective at very high frequencies because values for capacitor 202 and inductors 203-205 may be selected so that LC combinations resonate at a frequency of interest (i.e., the center frequency of the circuit). For example, L and C may be selected so that the output LC combination provides the necessary output impedance at high frequency for proper amplification of the signal.

In addition to achieving amplification at high frequencies, it is also necessary to achieve proper input matching. For example, when an antenna is coupled to the input of an amplifier for receiving an RF signal, the input impedance of the amplifier must be matched to the antenna. This is sometimes accomplished by placing a resistor at the amplifier input. However, resistors generate noise, and noise at the input of a receiver amplifier is very problematic because the noise level may be on the same order of magnitude as the incoming RF signal. Thus, using resistors at the input of an amplifier can make it difficult to distinguish signal from noise.

FIG. 2B is an equivalent input circuit for amplifier 200 that illustrates the advantageous noise properties of this architecture. The input impedance circuit of the amplifier includes series connected inductor 204 ("Lg"), MOS gate capacitance 206 ("Cg"), inductor 205 ("Ls") and an equivalent resistance 207 ("R1"). One advantage to amplifier 200 is that the values of inductors 204 ("Lg") and 205 ("Ls") may be sized so that the inductance and capacitance of the input circuit resonates at frequencies of interest (i.e., Lg, Cg and Ls are a short circuit at predetermined frequencies). Thus, the input impedance of the amplifier is set by the value of R1 near the resonant frequency. Since R1 is an equivalent resistance of the MOS transistor (e.g., R1=$(g_m Ls)/Cgs$), and not a physical resistor, the input impedance of the amplifier may be matched to the antenna without generating the noise typically associated with a physical resistor.

However, while such circuits have good noise performance and gain for particular frequencies, they are not effective across wide frequency ranges because as the signal frequency moves above or below the resonant frequency, the capacitance or inductance begins to dominate quickly. Consequently, amplifier 200 will not be able to provide amplification or input matching for input signals across a wide frequency range.

FIG. 3 illustrates a simplified diagram of a prior art approach to designing a high frequency amplifier that operates across a wide range of frequencies. Amplifier 300 includes a plurality of narrowband amplifiers 301-304 that are each optimized to operate in different narrow frequency ranges centered at a specific center frequency. The input of each amplifier is coupled through a corresponding switch S1-Sn to an antenna 310. When a specific frequency range is desired, the system closes the switch connecting the antenna to the particular amplifier optimized to operate across the desired frequency range. One problem with this approach is that information cannot be received on different frequency ranges unless the switches are reconfigured. Additionally, each switch introduces problematic parasitic capacitances. Furthermore, this approach is very expensive because of the additional components and integrated circuit die area required to implement multiple channels.

FIG. 4 illustrates a simplified diagram of another prior art amplifier circuit technique. One way of extending the frequency range of amplifier 400 is to provide resistive feedback. Amplifier 400 includes an MOS transistor 401 having gate coupled to receive an RF input signal ("Vin"), a source coupled to ground and a drain coupled to the output ("Vout"). A feedback resistor ("R") 402 is coupled between the drain output and source input. Resistor 402 may be set to provide wide band input matching and gain performance. However, while the frequency range of input matching and amplification may be extended as compared to amplifier 200, such techniques suffer from a variety of problems. First, resistors generate noise, and noise at the input will be amplified. Moreover, a portion of the noise at the output is also fed back and amplified. Thus, amplifiers using resistive feedback typically have a very poor noise figure ("NF"). Furthermore, feedback architectures typically have very high power consumption, which is also undesirable.

FIG. 5 illustrates a simplified diagram of another prior art amplifier circuit. Amplifier 500 illustrates a common gate approach. Amplifier 500 is advantageous because the source impedance of MOS transistor 501 may be used for impedance matching, thereby eliminating the need for a physical resistor for input matching. For example, the input impedance of M1 may be matched to the antenna by setting the device properties of M1. As a result, no physical resistor is necessary and the noise figure of the receiver is improved. However, one major problem with amplifier 500 is that common gate amplifiers have very low gain compared to other architectures.

Thus, there is a need for a high frequency receiver amplifier with improved noise performance that simultaneously provides improved gain and input matching across an ultra-wide bandwidth. The present invention solves these and other problems by providing high frequency wireless circuits and methods as describe below.

SUMMARY

Embodiments of the present invention include circuits for use in wireless receivers that provide wide band matching with improved gain and noise performance. In one embodiment, the present invention includes a wireless receiver comprising an antenna, a first transistor having a source coupled to the antenna, a second transistor having a gate coupled to the antenna and a network comprising a first terminal coupled to the antenna, a second terminal coupled to the source of the first transistor and a third terminal coupled to the gate of the second transistor, wherein the network has a transimpedance between the second and third terminals so that noise generated by the first transistor is differentially rejected by the system across a predetermined range of frequencies.

In another embodiment, the present invention may include a circuit for receiving high frequency signals across a range of frequencies comprising an antenna having an equivalent resistance, a first transistor having a source coupled to the antenna, a gate coupled to a first bias voltage and a drain, wherein the source input impedance of the first transistor matches the equivalent resistance of the antenna, a first resistor coupled to the drain of the first transistor, a second transistor having a source, a gate and a drain, wherein the second transistor has a transconductance during normal operation, a second resistor coupled to the drain of the second transistor and a noise rejection network coupled between the source of the first transistor and the gate of the second transistor, the noise rejection network having a transimpedance between the source of the first transistor and the gate of the second transistor, wherein the ratio of the first resistor to the second resistor is approximately equal to the product of the transconductance of the second transistor and the transimpedance of the noise rejection network.

In yet another embodiment, the present invention may include an electronic circuit comprising a common gate stage having a source input and drain output, a first resistance coupled to the drain output of the common gate stage, a common source stage having gate input coupled to the source input of the common gate stage and a drain output, the common source stage having a transconductance, a second resistance coupled to the drain output of the common source stage, and a network having a transimpedance coupled between the source input of the common gate stage and gate input of the common source stage, wherein the product of the transimpedance of the network and the transconductance of the common source stage is approximately equal to the ratio of the first resistance to the second resistance across a range of frequencies above two gigahertz.

In one embodiment, the present invention includes an integrated circuit comprising means for matching input impedance to an antenna, means for providing high tranconductance gain and a transimpdeance network coupled between the means for matching input impedance and the means for providing high tranconductance gain for receiving a current, and in accordance therewith, providing a voltage for rejecting common mode noise.

The following detailed description and accompanying drawings provide a better understanding of the nature and advantages of the present invention.

BRIEF DESCRIPTION OF THE DRAWINGS

FIGS. 2A-B illustrates a prior art receiver amplifier.

FIG. 3 illustrates a prior art approach to designing a high frequency amplifier that operates across a wide range of frequencies.

DETAILED DESCRIPTION

Described herein are techniques for improving the frequency performance, noise performance and gain of receiver amplifiers. In the following description, for purposes of explanation, numerous examples and specific details are set forth in order to provide a thorough understanding of different aspects of the present invention. It will be evident, however, to one skilled in the art that the present invention as defined by the claims may include some or all of the features in these examples alone or in combination with other features described below, and may further include obvious modifications and equivalents of the features and concepts described herein.

Figure 1A:
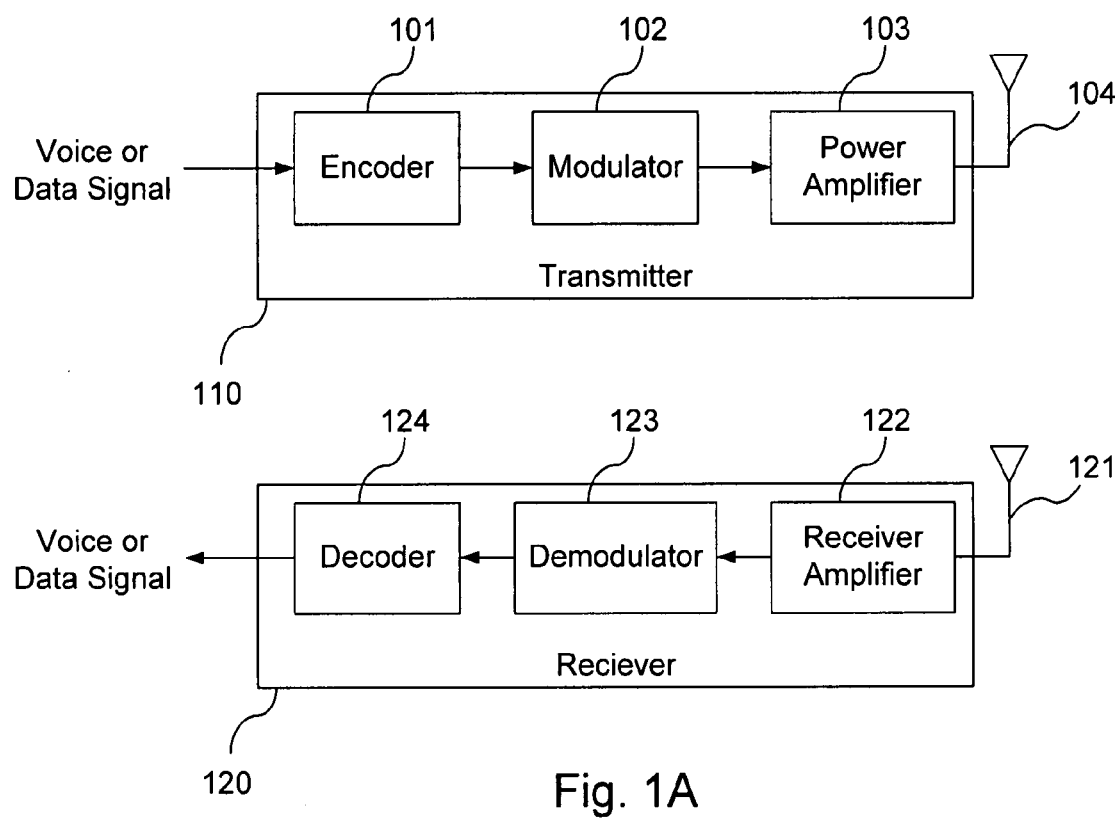
FIG. 1A illustrates a simplified wireless channel.
Figure 1B:
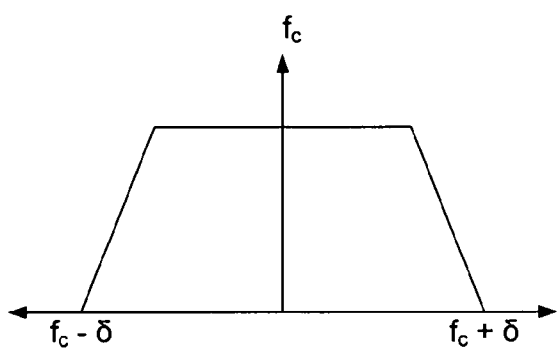
FIG. 1B illustrates the frequency spectrum of an encoded modulated signal.
Figure 4:
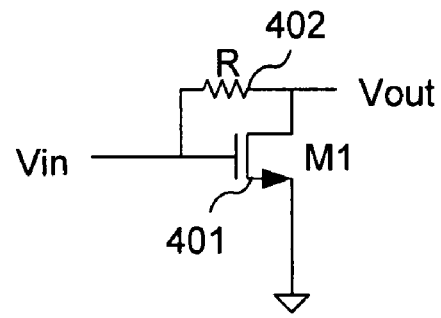
FIG. 4 illustrates a simplified diagram of another prior art amplifier circuit technique.
Figure 5:
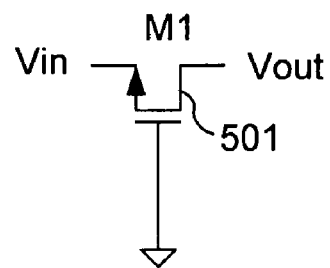
FIG. 5 illustrates a simplified diagram of another prior art amplifier circuit.
Figure 6:
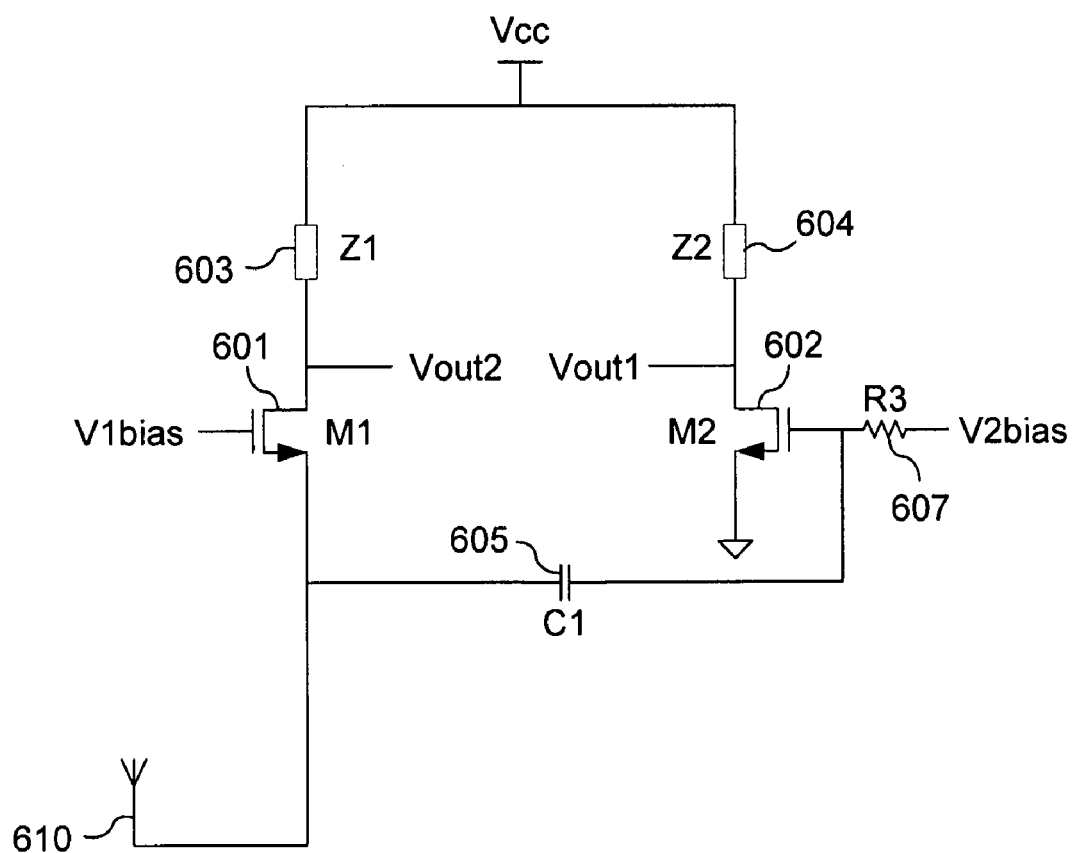
FIG. 6 illustrates a wide band amplifier circuit according to one embodiment of the present invention.

Embodiments of the present invention include high frequency wireless circuits and methods. FIG. 6 illustrates a high frequency amplifier circuit according to one embodiment of the present invention. High frequency amplifier 600 includes MOS transistors 601 and 602 (i.e., "M1" and "M2"), impedances 603 and 604 (i.e., Z1 and Z2) and capacitor 605 ("C1"). Transistor 601 has a gate coupled to a bias voltage (e.g., "V1bias"), a source coupled to an antenna 610 and a drain coupled one terminal of impedance 603. The node between the drain of transistor 601 and impedance 603 may be one output of the amplifier (e.g., labeled "Vout2"). Antenna 610 is also coupled through capacitor 605 to the gate of transistor 602. The source of transistor 602 is coupled to ground and the drain is coupled to one terminal of resistor 604. A bias voltage ("V2bias") is coupled to the gate of transistor 604 through a resistor 607 ("R3"). In one embodiment, R3 is 10-20 times the equivalent impedance of the antenna (e.g., 50Ω) so that the noise from R3 has negligible effect. The node between the drain of transistor 602 and impedance 604 may be another output of the amplifier (e.g., labeled "Vout1"). Capacitor 605 is an AC coupling capacitor, which allows the DC voltage at the gate of transistor 602 to be set at a different value (e.g., V1bias") than the DC voltage at the source of transistor 601.

One advantage to using the amplifier architecture shown in FIG. 6 in high frequency applications is that the "unbalanced" signal (i.e., a single ended signal) from the antenna is converted into a "balanced" signal (i.e., differential signal) at the output (i.e., Vout1–Vout2). Differential signals have improved noise and distortion immunity because the amplitude of the combined signal is determined by the amplitude difference between each of the differential signal components. In the case of amplifier 600, the amplified high frequency signal from antenna 610 is the difference between the two outputs Vout1 and Vout2 (i.e., |Vout1–Vout2|=Av*|Vin|). Thus, noise introduced into both signal paths (i.e., Vout1 and Vout2) will have no effect.

Another advantage of the amplifier architecture shown in FIG. 6 is that transistor 601 may be used for input impedance matching, while transistor 602 may be used for high transconductance gain. For example, the input impedance ("$Z_{in}$") of a common gate MOS transistor is given approximately by the following equation:

$$Z_{in}=1/(g_m+g_{mbulk})=1/g_{mT},$$

where $g_m$ is the transconductance of the MOS transistor, $g_{mbulk}$ is the transconductance of the bulk and $g_{mT}$ is the combined (i.e., "total") transconductance. However, the transconductance of an MOS transistor may be tailored to produce the desired input impedance. For example, the transconductance is given approximately by the following equations:

$$g_m=\mu_n C_{ox}(W/L)(Vgs-Vth),$$

$$g_m=\overline{2\mu_n C_{ox}(W/L)I_D},$$

$$g_m=2I_D/(Vgs-Vth),$$

and $g_{mbulk}$ ⅓ $g_m$. Thus, the above equations may be used to set the transconductance of M1 so that input matching with the antenna is achieved (e.g., $g_{mT}=1/Zin=1/50Ω$). For example, the dimensions of the transistor (e.g., width, "W" or length, "L") and bias voltage ("V1bias") may be adjusted input impedance matching is obtained.

Figure 7A:
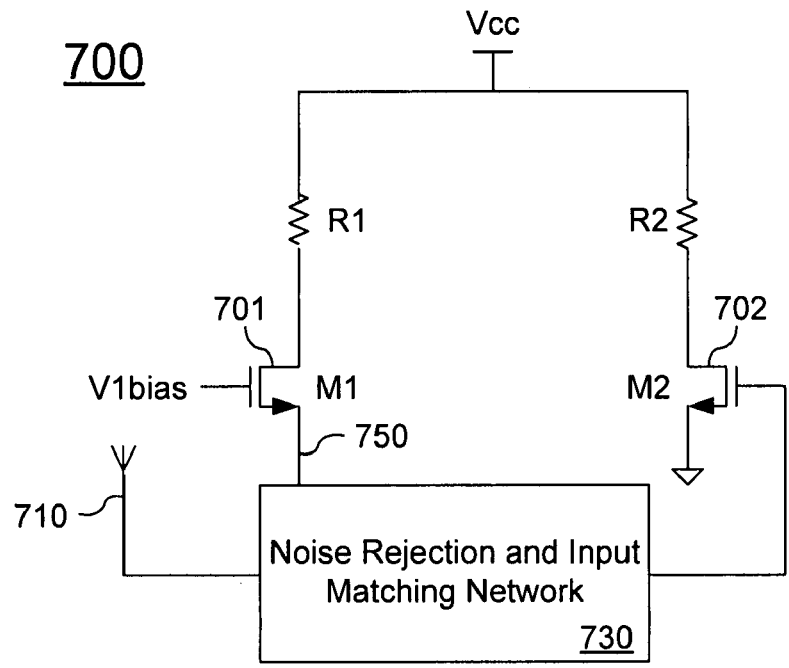
FIGS. 7A-C illustrate wide band architectures according to embodiments of the present invention.

FIG. 7A illustrates a high frequency architecture according to one embodiment of the present invention. In architecture 700, the source of MOS transistor 701 is coupled to one terminal of a noise rejection and input matching network 730. Noise rejection and input matching network 730 may provide wide band input matching, wide band noise rejection matching and, in some embodiments, provide gain between the source of M1 and the gate of M2 to further reduce the noise from M2. For example, noise rejection and input matching network 730 may include a matching network to couple signal from the antenna to the inputs of transistors 701 and 702. Noise rejection and input matching network 730 may further include a transimpedance circuit, $Z_N(\omega)$, looking outward from the source of transistor 701 to the gate of transistor 702 that maintains sufficient noise rejection across a desire wide band frequency range of interest. Wide band noise rejection matching is achieved by introducing reactive passive components such as inductance and capacitance to control the response of $Z_N(\omega)$. The result is that the noise current is rejected differentially and the noise performance of the system is improved. Wide band input matching is similarly maintained by introducing reactive passive components such as inductance and capacitance to control the response of $Z_{in}(\omega)$ as seen by antenna 710.

Figure 7B:
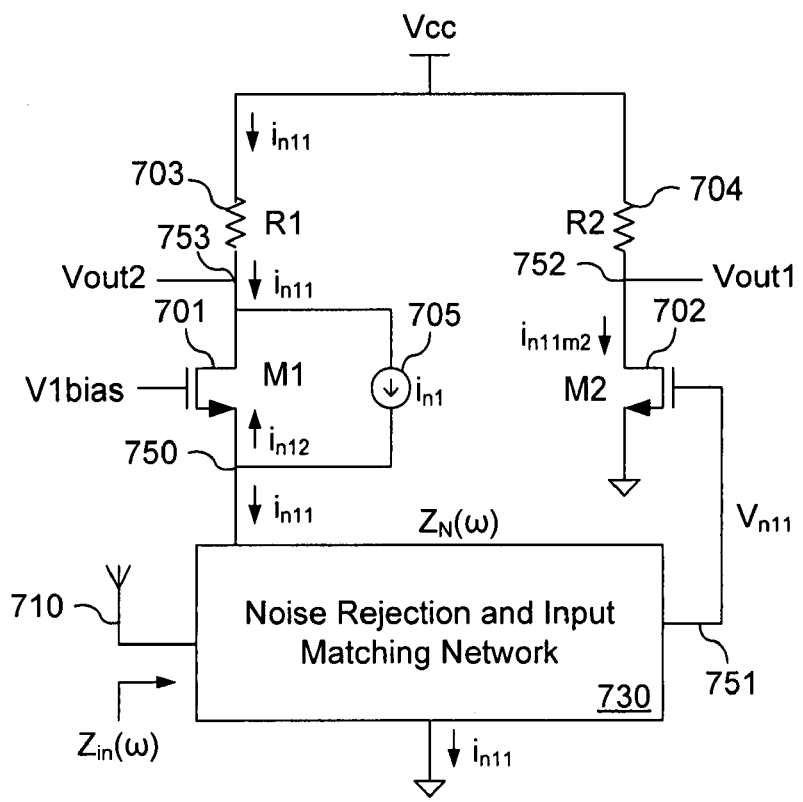

FIG. 7B illustrates noise rejection in more detail. FIG. 7B includes a noise source 705 ("$i_{n1}$") that represents the thermal noise current introduced by transistor 701. At node 750, $i_{n1}$ splits into $i_{n12}$ and $i_{n11}$. Current $i_{n11}$ is input into noise rejection and input matching network 730. Current $i_{n11}$ creates a voltage $V_{n11}$ at node 751 due to transimpedance $Z_N(\omega)$ (i.e., $V_{n11}=i_{n11}Z_N(\omega)$). Transimpedance $Z_N(\omega)$ may include the parasitic source capacitance of M1, the parasitic gate capacitance of M2, the equivalent source resistance of the antenna and other non-parasitic impedances on other current paths from node 750 to ground. Thus, the effect of $i_{n11}$ is to create a current $i_{n11m2}$ in transistor 702 as follows:

$$i_{n11m2}=g_{m2}V_{n11}$$

$$i_{n11m2}=g_{m2}(i_{n11}Z_N(\omega))$$

The change in output voltage on output node 752 cause by $i_{n1}$ is as follows:

$$V_{out1,n1}=i_{n11m2}R2$$

$$V_{out1,n1}=[g_{m2}(i_{n11}Z_N(\omega))]R2.$$

Additionally, current $i_{n11}$ flows through ground and returns through supply terminal Vcc.

Thus, the effect of $i_{n11}$ on output node 753 is as follows:

$$V_{out1,n2}=i_{n11}R1.$$

$V_{out1,n2}$ is a result of $i_{n11}$ returning through the supply and flowing through R1. Thus, if devices are tailored so that the effect on $V_{out1,n1}$ is the same as the effect on $V_{out1,n2}$, the noise from transistor 701 has zero differential effect (i.e., the noise appears as a common mode signal and is differentially rejected by the system). Differential noise rejection occurs as follows:

$$V_{out1,n1}=V_{out1,n2}$$

$$[g_{m2}(i_{n11}Z_N(\omega))]R2=i_{n11}R1$$

$$R1=g_{m2}Z_N(\omega)R2.$$

For example, one advantageous embodiment is when R1=R2. In this case, the output is symmetric. When R1=R2, differential noise rejection may be obtained by setting $g_{m2}=1/Z_N(\omega)$, wherein $Z_N(\omega)$ is on the order of about 50Ω.

However, another major source of noise in the circuit is transistor 702 ("M2"). In another embodiment, it may be desirable to further minimize the Noise Figure of the circuit by minimizing the noise contribution of M2. The Noise Figure may be decreased, thereby improving noise performance of the system, by increasing the transconductance $g_{m2}$ of transistor 702 and making R1 greater than R2 (i.e., R1>R2). For example, if the transconductance $g_{m2}$ is increased to improve noise performance, the corresponding noise current $i_{n11m2}$ also increases. In one embodiment of the present invention, the noise contribution of transistor 702 may be reduced, by increasing $g_{m2}$ by a factor of X where X is some number preferably in the range of about two (2) to four (4) (i.e., 2→4, although it may be larger or smaller). To compensate for the increase in current $i_{n11m2}$ caused by the increase in $g_{m2}$, R2 is decreased by a factor of X so that noise rejection is maintained. In other words, because R1 must be greater than R2 by a factor of $g_{m2}Z_N(\omega)$, or as close thereto as possible, in order to maintain rejection, if $g_{m2}$ increases by 2, for example, then R2 must be reduced by a factor of 2 to maintain the noise rejection relation.

Figure 7C:
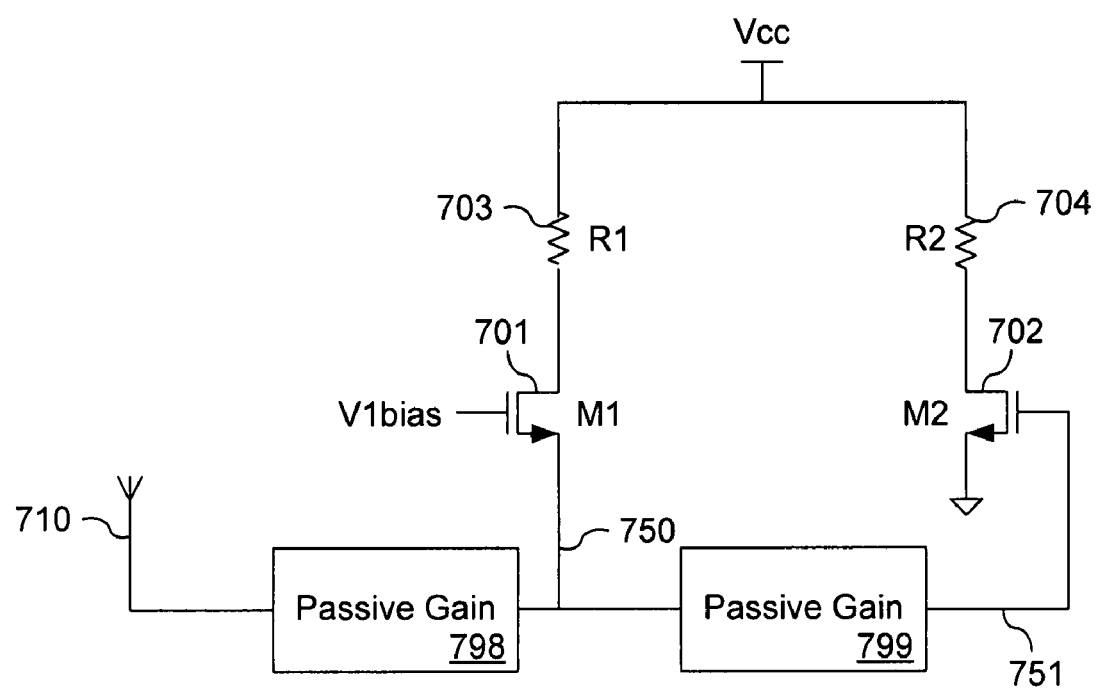

FIG. 7C illustrates another embodiment of the present invention. In one embodiment, noise rejection and input matching network includes passive gain at the input. For example, the system may include passive gain between the antenna and node 750 or alternatively between node 750 and node 751, or both. With passive gain at the input, the noise contributions of the transistors M1 or M2, or both, are less pronounced. For example, if the system includes only passive gain 799 ("α"), the noise rejection will occur as follows:

$$R1=g_{m2}Z_N(\omega)R2$$

Where $Z_N(\omega)=\alpha/Rs$, and Rs is an equivalent resistance "Rs" of the antenna. Noise contribution from M2 is less pronounced by a factor of $\alpha^2$ so one can choose a smaller $g_{m2}$, which allows for lower power consumption.

Similarly, if the system includes only passive gain 798 ("β"), the input impedance of M1 can be increased by a factor of $\beta^2$, which means $g_{m1}$ may be decreased and M1 will consume less power. Furthermore, the noise contribution of M1, R1, M2, R2 is less pronounced by a factor $\beta^2$, allowing for even further reduction in $g_{m2}$, and thus power consumption. Noise rejection is maintained as follows:

$$R1=g_{m2}Z_N(\omega)R2.$$

Where $Z_N(\omega)=\beta^2 Rs$, and Rs is an equivalent resistance "Rs" of the antenna.

For example, if α=1 and β=1 (i.e., no passive gain), then $g_{m1}=1/50\Omega$, $g_{m2}=3(g_{m1})$ and R2=(⅓)R1. However, if α=2 and β=1 (i.e., passive gain 799), then $g_{m1}=1/50\Omega$, $g_{m2}=¾(g_{m1})$ and R2=(⅔)R1. Alternatively, if α=1 and β=2 (i.e., passive gain 798), then $g_{m1}=1/200\Omega$, $g_{m2}=¼(g_{m1})$ and R2=(⅓)R1. In a wide band implementation, transimpedance circuit may implement passive gain using a wide band transformer, for example. In a narrowband implementation, transimpedance circuit may include an LC network.

From the relationships described above it can be seen that one important factor for high frequency circuit performance is the relationship between $g_{m2}$ and $Z_N(\omega)$. For high frequencies of interest, such as frequencies above 2 GHz, the frequency response of $Z_N(\omega)$ is carefully tailored to achieve proper circuit behavior. The behavior of $Z_N(\omega)$ is especially important for proper operation across wide frequency ranges such as, for example, between 3 GHz to 10 GHz.

Figure 8:
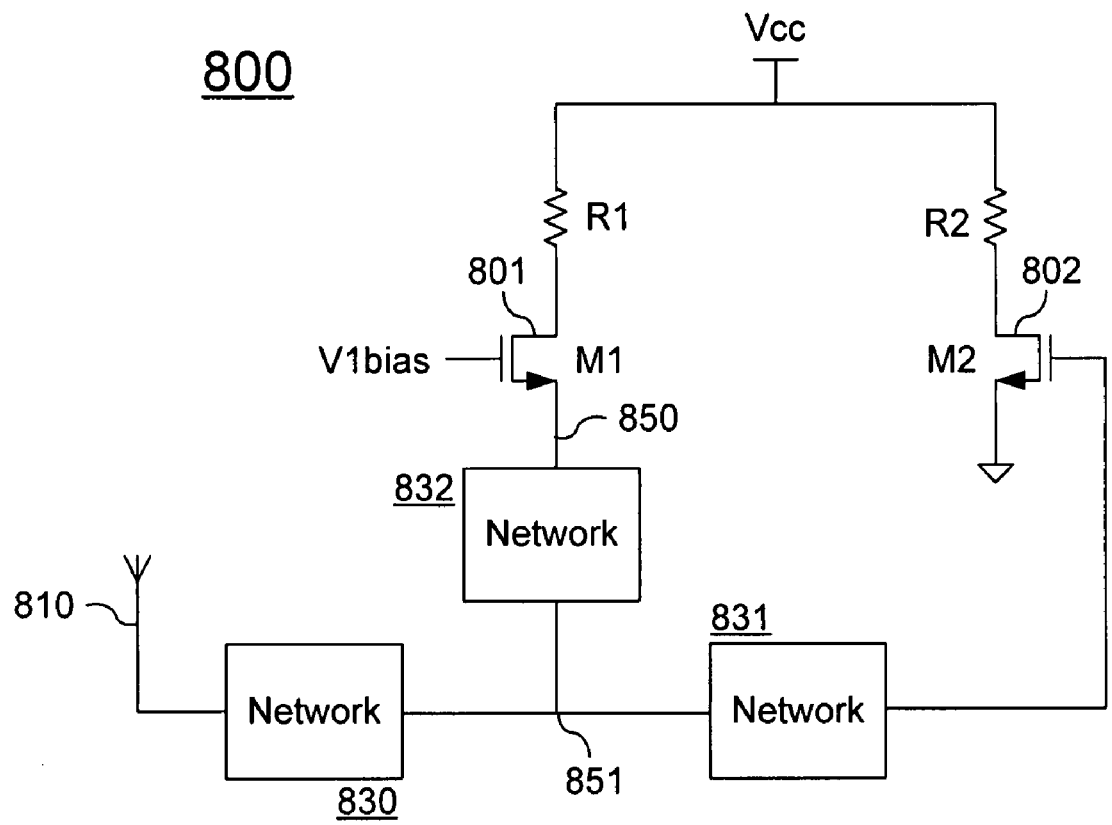
FIG. 8 is an example of a noise rejection and input matching network according to another embodiment of the present invention.

FIG. 8 is an example of a noise rejection and input matching network according to one embodiment of the present invention. Noise rejection and input matching network may include a first network 830 coupled between antenna 810 and node 851. Network 830 may include, for example, parasitic inductance, parasitic capacitance and an introduced inductance or capacitance tailored to achieve the appropriate $Z_N(\omega)$ across a desired high frequency range. Network 832 is coupled between node 851 and the source input of MOS transistor 801, and may include an introduced inductance or capacitance tailored to achieve the appropriate $Z_N(\omega)$ across a desired high frequency range. Network 831 is coupled between node 851 and the gate input of MOS transistor 802, and may include an introduced inductance or capacitance tailored to achieve the appropriate $Z_N(\omega)$ across a desired high frequency range.

Figure 9:
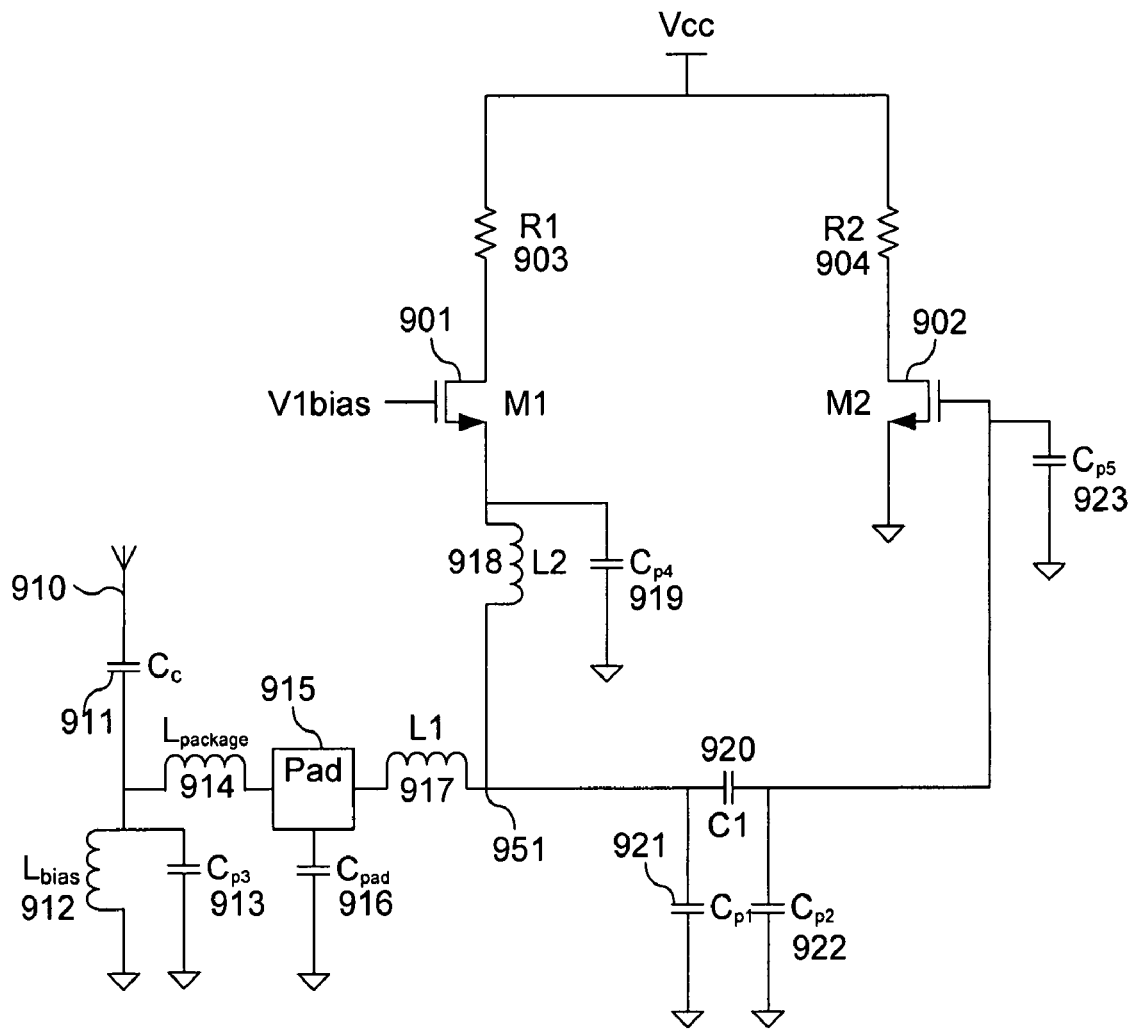
FIG. 9 is an example of an amplifier according to another embodiment of the present invention.

FIG. 9 is an example of an amplifier according to another embodiment of the present invention. Amplifier 900 illustrates the elements of the circuit at high frequency. Antenna 910 is coupled in series with an AC coupling capacitor 911 and bias inductor 912. It is to be understood that antenna 910 would introduce an equivalent resistance "Rs" to ground at high frequencies. Bias inductor 912 has an associated parasitic capacitance 913 ("$C_{p3}$"). In one embodiment, amplifier 900 may be part of an integrated circuit. Thus, an inductance 914 ("$L_{package}$") from the integrated circuit ("IC") package and bond wire is included in the circuit. Bond wires from an integrated circuit package are typically connected to a "pad" 915 on the integrated circuit die, and the pad has a corresponding parasitic capacitance 916 ("$C_{pad}$") that is also be accounted for. Coupling capacitor 920 ("C1") has associated parasitic capacitances 921 ("$C_{p1}$") and 922 ("$C_{p2}$"), and the source of MOS transistor 901 and the gate of MOS transistor 902 have parasitic capacitances 919 ("$C_{p4}$") and 923 ("$C_{p5}$"), respectively. In one embodiment, amplifier 900 further includes an inductor 917 ("L1") coupled between the IC pad 915 and node 951. Amplifier 900 may also include a second inductor 918 ("L2") coupled between the source of transistor 901 and node 951. Inductors L1 and L2 may be sized to achieve the desired level of noise rejection.

Figure 10:
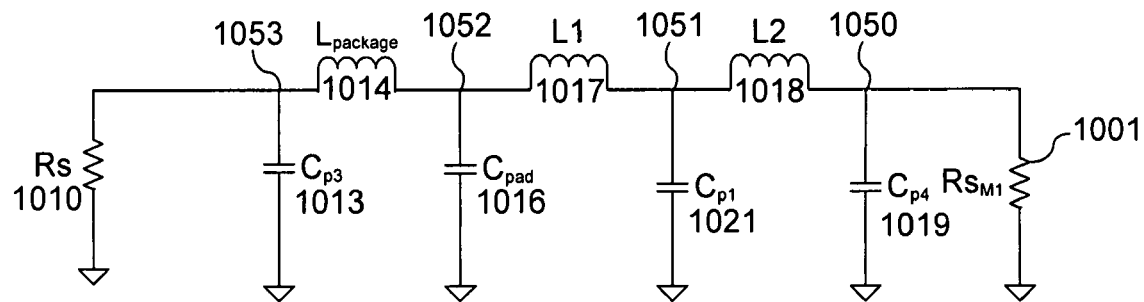
FIG. 10 is an example of a ladder network according one embodiment of the present invention.

FIG. 10 is an example of a ladder network according one embodiment of the present invention. The placement of inductors L1 and L2 is particularly advantageous because the resulting circuit is a LC ladder network. A first terminal of antenna source resistance 1010 ("Rs") is coupled to ground and a second terminal is coupled to series inductances 1014, 1017 and 1018 (i.e., "$L_{package}$", L1 and L2). It is to be understood that "Cc" and "$L_{bias}$" will have a negligible effect across high frequency ranges of interest. Each inductance is coupled to a capacitance to ground. For instance, node 1053 of inductance 1014 is coupled to ground through capacitance 1013, intermittent node 1052 between inductance 1014 and inductance 1017 is coupled to ground through capacitance 1013, intermittent node 1051 between inductance 1017 and inductance 1018 is coupled to ground through capacitance 1021, and node 1050 is coupled to ground through capacitance 1019. Finally, the source resistance of MOS transistor 1001 is coupled between node 1050 and ground. Consequently, the circuit may be symmetric to provide both input matching and noise rejection matching.

Frequency performance of the circuit may be controlled by tailoring inductors L1 and L2, and optionally tailoring parasitic capacitances, to achieve desired results. For example, the ladder circuit values may be set so that wide band input matching is achieved from the point of view of the antenna while simultaneously achieving wide band noise rejection from the point to view of the source of M1. The result is a desired level of noise rejection across a predetermined frequency range (e.g., 3 GHz-10 GHz).

Figure 11:
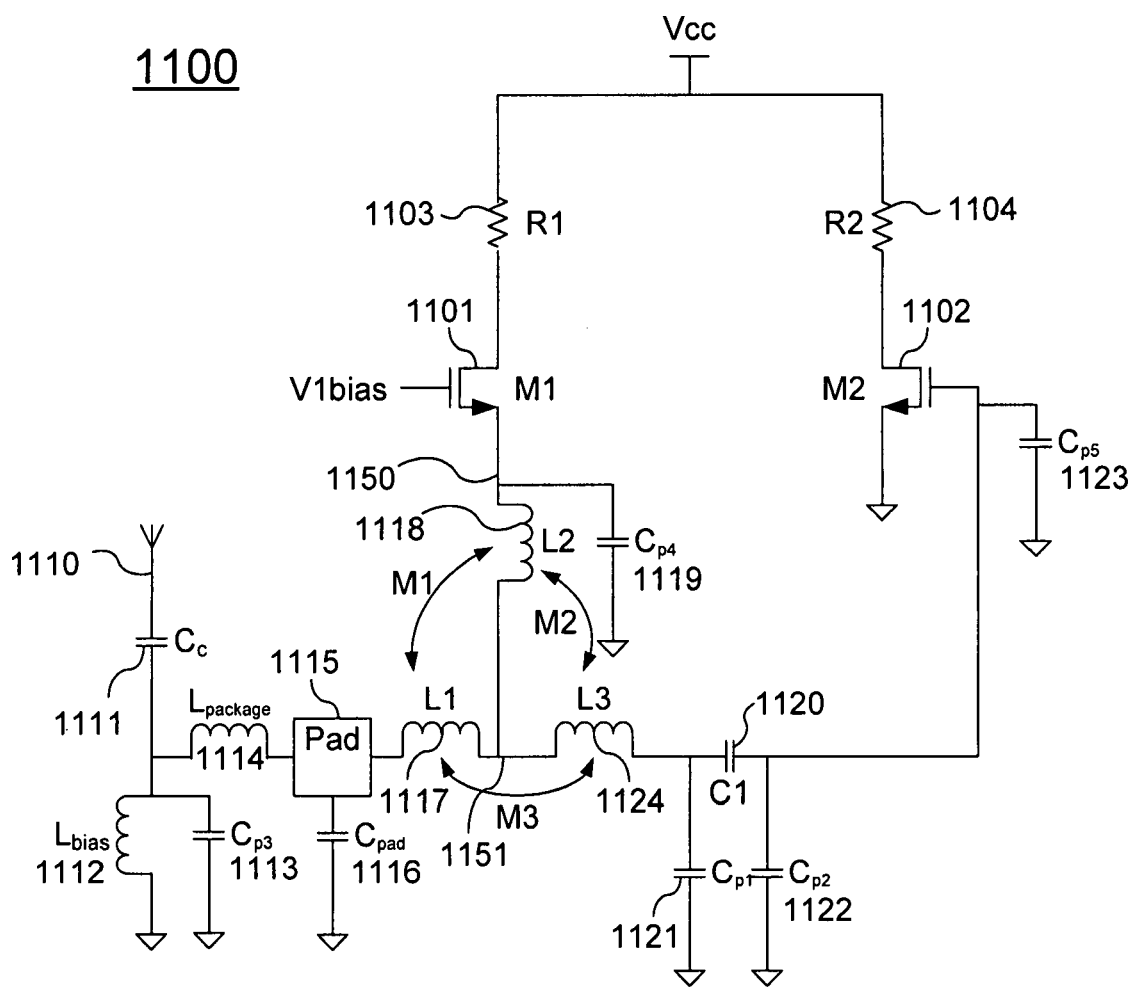
FIG. 11 is another example of a circuit according one embodiment of the present invention.

FIG. 11 is another example of a circuit according one embodiment of the present invention. For example, in one embodiment, inductors 1117 ("L1") and inductor 1118 ("L2") may be mutually inductive ("M") to further improve the frequency characteristics of the system. Also, a degree of freedom may be added to the circuit by including inductor 1124 ("L3"), which may be mutually inductive with either L1 or L2, or both. Extra degrees of freedom allow the designer to further tailor the frequency characteristics of the circuit to further improve performance criteria such as, for example, noise rejection.

Figure 12:
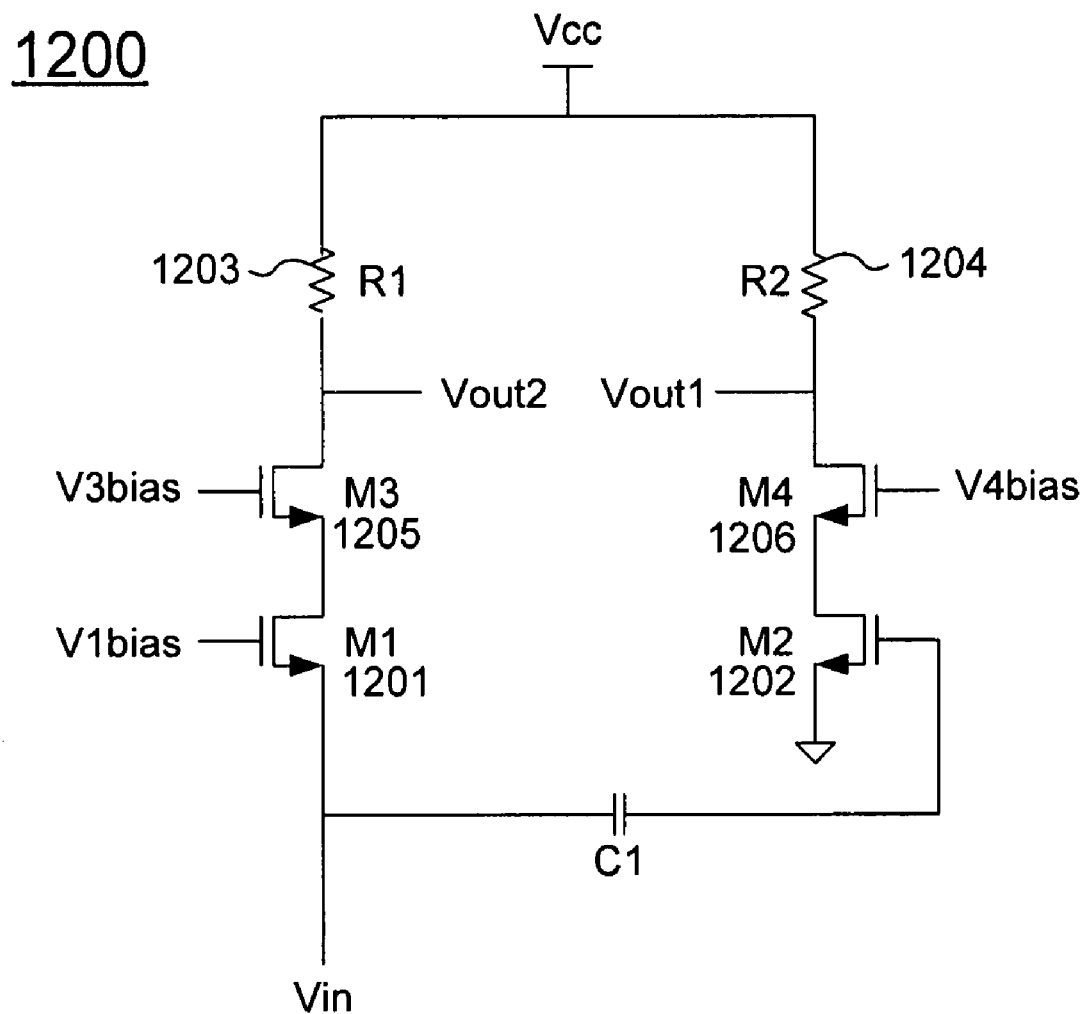
FIG. 12 is an example of an amplifier according one embodiment of the present invention.

FIG. 12 is an example of an amplifier according one embodiment of the present invention. At high frequencies, parasitic capacitances at both the input and the output of an amplifier can become problematic. Amplifier 1200 includes an MOS transistor 1202 having a gate coupled to a high frequency input signal Vin, a source coupled to ground and a drain coupled to the source of transistor 1206. The gate of transistor 1206 is coupled to bias voltage V4bias and the drain is coupled to one terminal of resistor 1204 ("R2"). Amplifier 1200 also includes an MOS transistor 1201 having a source coupled to high frequency input signal Vin, a gate coupled to a bias voltage ("V1bias") and a drain coupled to the source of transistor 1203. The gate of transistor 1203 is coupled to bias voltage V3bias and the drain is coupled to one terminal of resistor 1203 ("R1"). The output of the amplifier may be the difference between the voltages at the drains of transistors 1206 and 1206. In one embodiment, MOS transistors 1205 and 1206 are smaller in dimension than MOS transistors 1201 and 1202. For example, MOS transistors 1205 and 1206 may be only one-third (⅓) the size of transistors 1201 and 1202. Consequently, the output capacitance of transistors 1205 and 1206 (i.e., the output capacitance of the amplifier) may be greatly reduced. Consequently, the bandwidth of the amplifier is improved.

FIG. 12 also illustrates another aspect of an amplifier according one embodiment of the present invention. According to another embodiment of the present invention additional gain may be generated by sacrificing some noise rejection. For example, recall that for noise rejection, the value of R2 is going to be some fraction of R1 (i.e., R1>R2). Thus, Vout2 will constrain the bandwidth of the system. Consequently, R1 may be set at a maximum value for a given bandwidth requirement, and transistors 1201 and 1205 and Vout2 will may operate maximum speed. However, since R2 is less than R1, Vout1 has some bandwidth margin. The gain of the amplifier may be increased by increasing R2, thereby sacrificing some noise rejection. However, while some noise rejection is sacrificed, the increased gain may improve the Noise Figure of the amplifier.

Figure 13A:
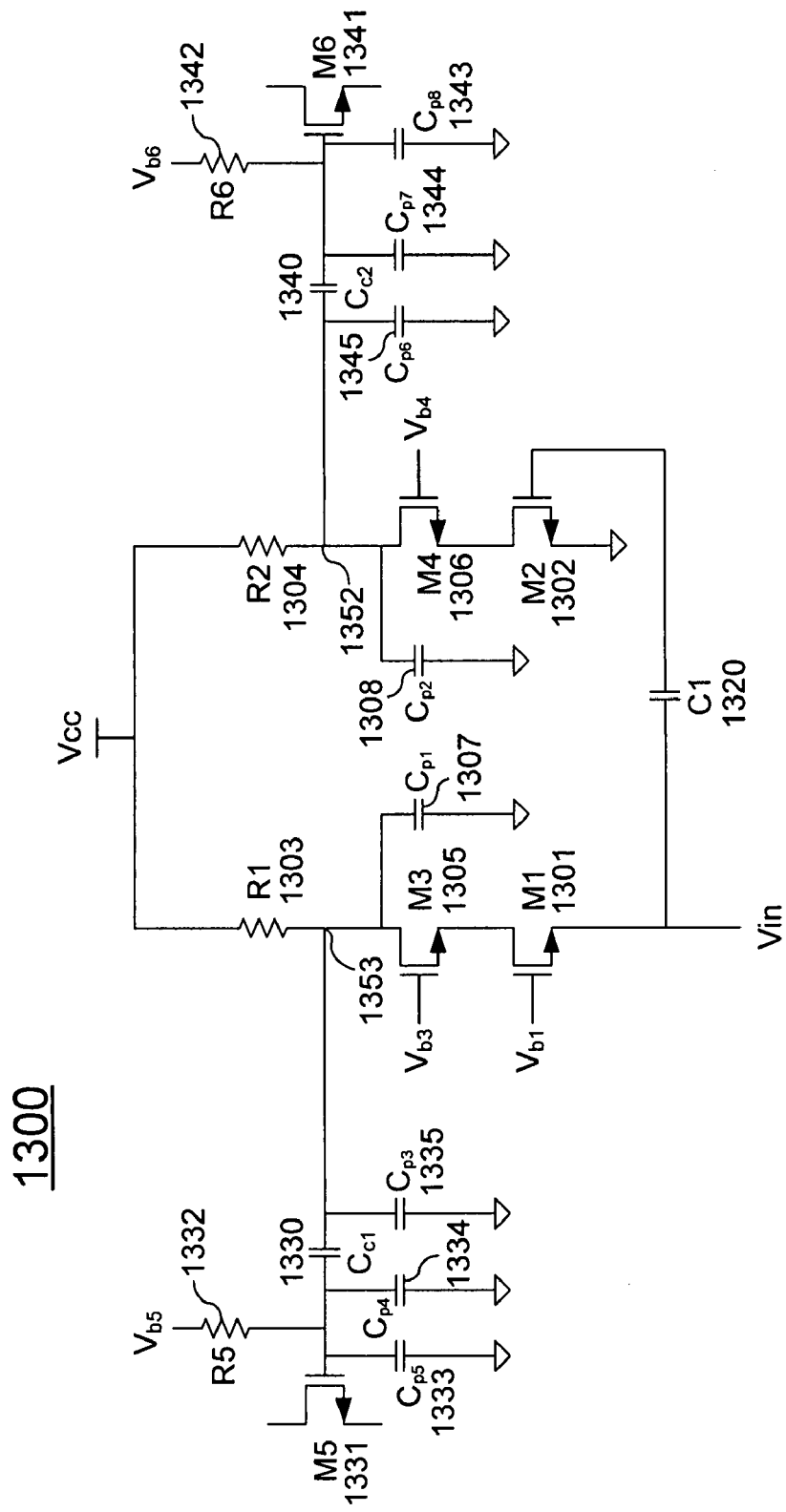
FIG. 13A is an example of an amplifier according one embodiment of the present invention.

FIG. 13A is an example of an amplifier according one embodiment of the present invention. In FIG. 13A, the outputs amplifier 1300 at nodes 1353 and 1352 are coupled differentially to a subsequent stage though AC coupling capacitors 1330 and 1340 to the gates of transistors 1331 and 1341, respectively. While transistors 1305 and 1306 reduce the output capacitance of amplifier 1300, bandwidth may still be limited by parasitic capacitances 1307, 1308, 1333-1335 and 1343-1345. These capacitances may become particularly problematic at very high frequencies above 2 GHz, for example, because parasitic capacitances load down the output and reduce bandwidth.

Figure 13B:
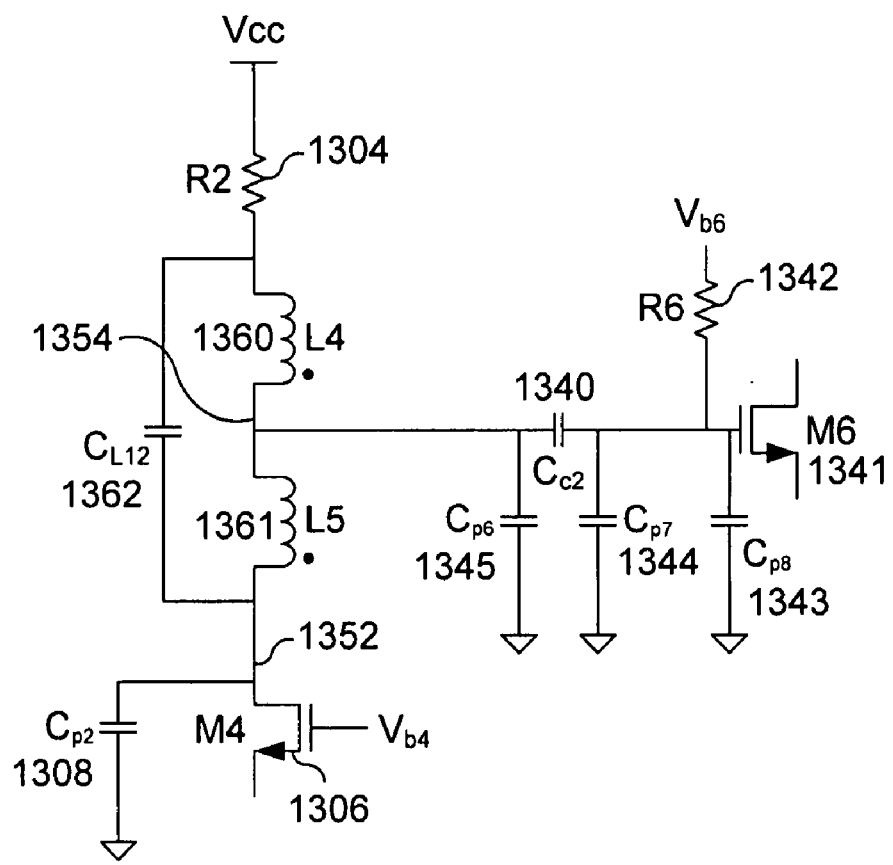
FIG. 13B illustrates an output circuit that may be used to further improve bandwidth performance according to one embodiment of the present invention.
Figure 13C:
FIG. 13C illustrates another output circuit that may be used according to another embodiment of the present invention.

FIG. 13B is an example of an output circuit that may be used to further improve bandwidth performance according to one embodiment of the present invention. In FIG. 13B, only one-half of the output stage of amplifier 1300 is shown. However, it is to be understood that the output circuit in FIG. 13B would be the same for both outputs. Amplifier 1300 may include a first inductor 1360 ("L4") is coupled between output node (e.g., node 1354) and one terminal of resistor 1304. A second inductor 1361 ("L5") may be coupled between the drain of transistor 1306 (i.e., node 1352) and output node 1354. Capacitor 1362 ("C12") is coupled across both inductors from node 1352 to the terminal of resistor 1304. The parasitic drain capacitance 1308 at node 1352 is thereby separated from the parasitic capacitances 1343-1345 of AC coupling capacitor 1340 and transistor 1341. In one embodiment, only inductor 1360 is used and the bandwidth of the circuit improves by 150%. In another embodiment, two mutual inductors inductor 1360 and 1361 are used, and the bandwidth is increased by 2-2.5 times. FIG. 13C illustrates another output circuit that may be used instead of using mutual inductors 1360 and 1361.

Figure 14:
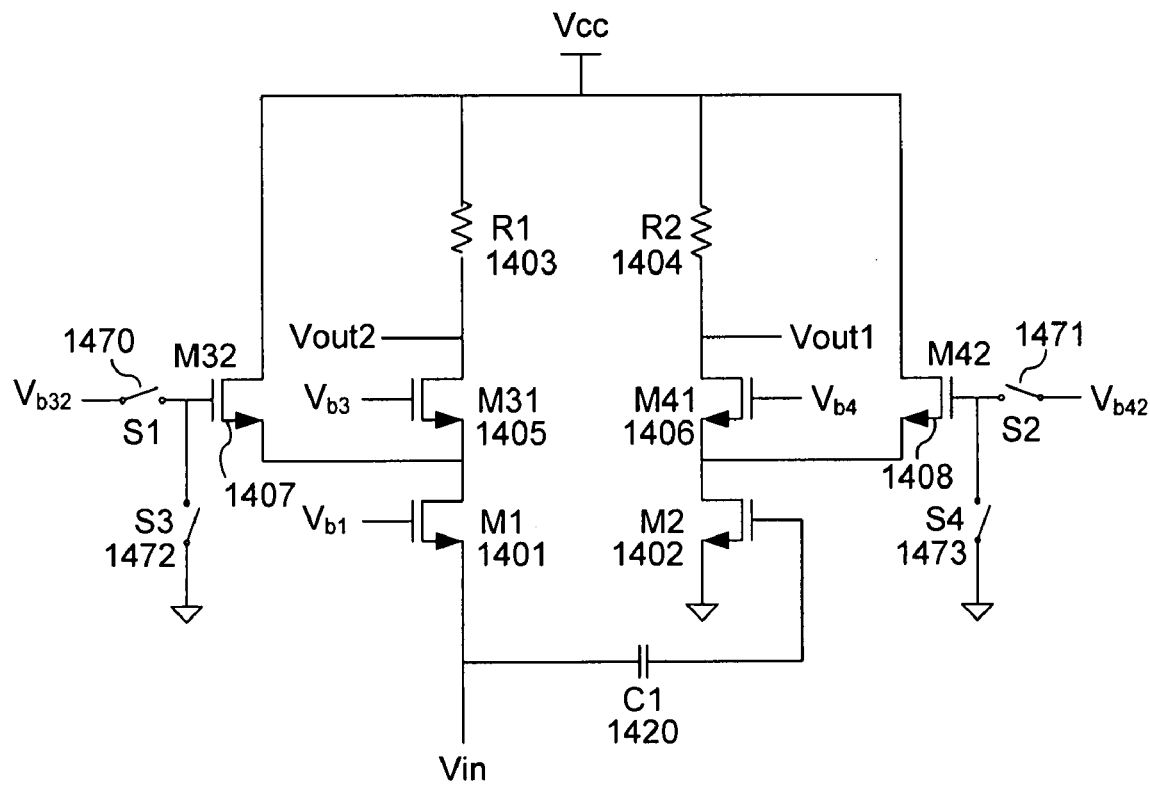
FIG. 14 is an example of an amplifier circuit with adjustable gain according to one embodiment of the present invention.

FIG. 14 is an example of an amplifier circuit with adjustable gain according to one embodiment of the present invention. Amplifier 1400 includes a common source connected MOS transistor 1402 having a drain coupled to the first output Vout1 through cascode transistor 1406. Amplifier 1400 also includes a common gate connected MOS transistor 1401 having a drain coupled to the second output Vout2 through cascode transistor 1405. Parallel MOS transistors 1407 ("M32") and 1408 ("M42") are provided to reduce the current transferred to the output and thereby reduce the gain. MOS transistor 1407 includes a source coupled to the drain of transistor 1401, a drain coupled to supply voltage ("Vcc") and a gate coupled to one terminal of switch 1470 ("S1"). MOS transistor 1408 includes a source coupled to the drain of transistor 1402, a drain coupled to supply voltage ("Vcc") and a gate coupled to one terminal of switch 1471 ("S2"). Transistors 1407 and 1408 may be activated by closing switches 1470 and 1471, which couple bias voltages $V_{b32}$ and $V_{b42}$ to the gates of each transistor, respectively. Thus, when the switches are closed, transistors 1407 and 1408 provide current into the drain of transistors 1401 and 1402, thereby reducing the amplitude of the signal at the output node for a given input signal. Alternatively, when the switches are open all of the current from transistors 1401 and 1402 is transferred to the output, and the system may operate at its full gain. In one embodiment, the switches are controlled by an enable signal, wherein if the enable signal is active the corresponding transistor is on, and if the enable signal is inactive the corresponding transistor is off. The difference in gain may be set according to the relative size (i.e., dimension) of transistors 1405 to transistor 1407 and by the relative size of transistor 1406 to transistor 1408. Therefore, by opening or closing switches 1470 and 1471, the gain of amplifier may be increased or decreased by an amount that can be predefined during design.

Figure 15:
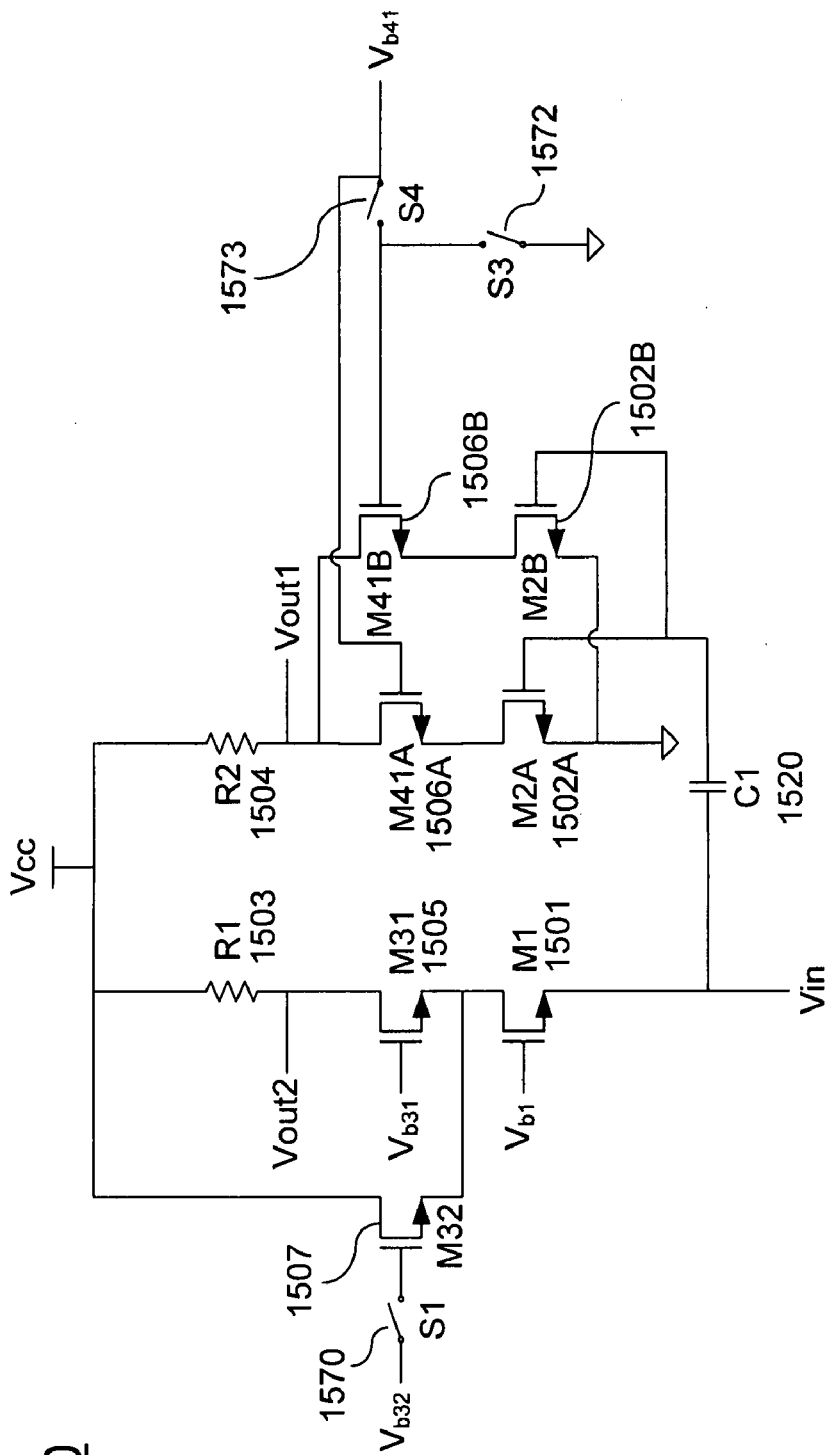
FIG. 15 is an example of an amplifier circuit with adjustable gain according to another embodiment of the present invention.

FIG. 15 is an example of an amplifier circuit with adjustable gain according to another embodiment of the present invention. In amplifier 1500, transistors 1502 and 1506 are split into multiple devices. For example, transistor 1502 ("M2") may be split into transistors 1502A ("M2A") and 1502B ("M2B"). Similarly, transistor 1506 ("M41") may be split into transistors 1506A ("M41A") and 1506B ("M41B"). Vin is received at the gates of transistors 1502A and 1502B. Each of these transistors has a source coupled to a bias voltage Vb2. The drain of transistor 1502A is coupled to the source of cascode transistor 1506A and the source of gain control transistor 1508. The drain of transistor 1502B is coupled to the source of cascode transistor 1506B, and the drains of transistors 1506A and 1506B are coupled to node 1552 ("Vout1"). The power consumption of amplifier 1500 may be reduced by turning off transistors 1502B and 1506B (e.g., when a strong signal is being received and less gain is required). For example, the gate of transistor 1506B may be coupled to a switch network such as switches 1572 ("S3") and 1573 ("S4"). When switch 1573 is closed (e.g., by an enable signal) and switch 1572 is open, a bias voltage is provided to both cascode transistors 1506A and 1506B through resistor 1574 ("R3"). To reduce the gain and power consumption, switch 1573 may be opened and switch 1572 closed, thereby grounding the gate of transistor 1506B and turning off the current into transistor 1502B.

Figure 16:
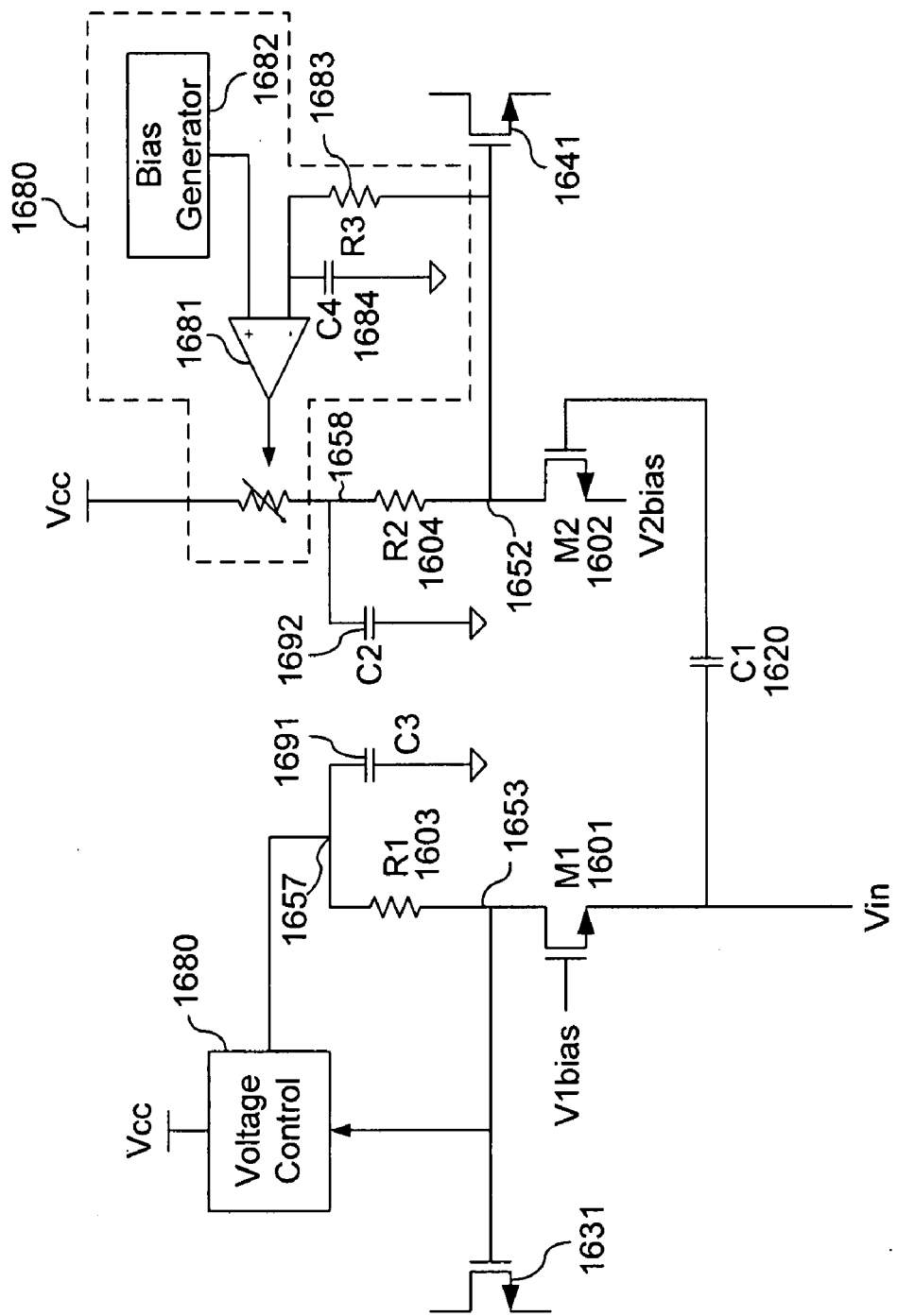
FIG. 16 is an example of an amplifier with DC coupled output stage according to one embodiment of the present invention.

FIG. 16 is an example of an amplifier 1600 with DC coupled output stage according to one embodiment of the present invention. The outputs of amplifier 1600 at nodes 1652 and 1653 are DC coupled to the gate inputs of transistors 1631 and 1641 of subsequent stages (e.g., another amplifier stage or a mixer stage). A voltage control circuit 1680 is coupled to output node (e.g., node 1653) and generates a voltage at node 1657 so that the subsequent stage is properly biased. Voltage control circuit 1680 is further coupled to supply voltage Vcc and may include an internal reference voltage. The exact design of voltage control circuit 1680 may differ depending on the desired voltage biasing to be achieved. However, this technique is particularly advantageous in very high frequency amplifier designs because it allows the circuit to change the voltage at nodes 1657 and 1658 (either alone or together), and controls the DC output voltage of amplifier 1600 so that subsequent stages are properly biased. Consequently, the need for AC coupling capacitors and their associated parasitic capacitances is eliminated, thereby increasing the bandwidth of the system.

One example of voltage control circuit 1680 is shown as comprising elements 1681-1685. Voltage control circuit 1680 may include a feedback resistor 1683 having a first terminal coupled to the gate of transistor 1641 and a second terminal coupled to amplifier 1681. A capacitor 1684 may be included at the input of amplifier 1681. The second input to amplifier 1681 is coupled to a bias generator 1682, which may include a diode connected transistor coupled to a current source for generating a constant reference voltage that tracks process and temperature, for example. The output of amplifier 1681 may be used to control a voltage regulation device, such as a variable resistor 1685 to set the voltage at node 1658. Variable resistor 1685 may be a controlled impedance such as a MOS transistor, for example.

Figure 17:
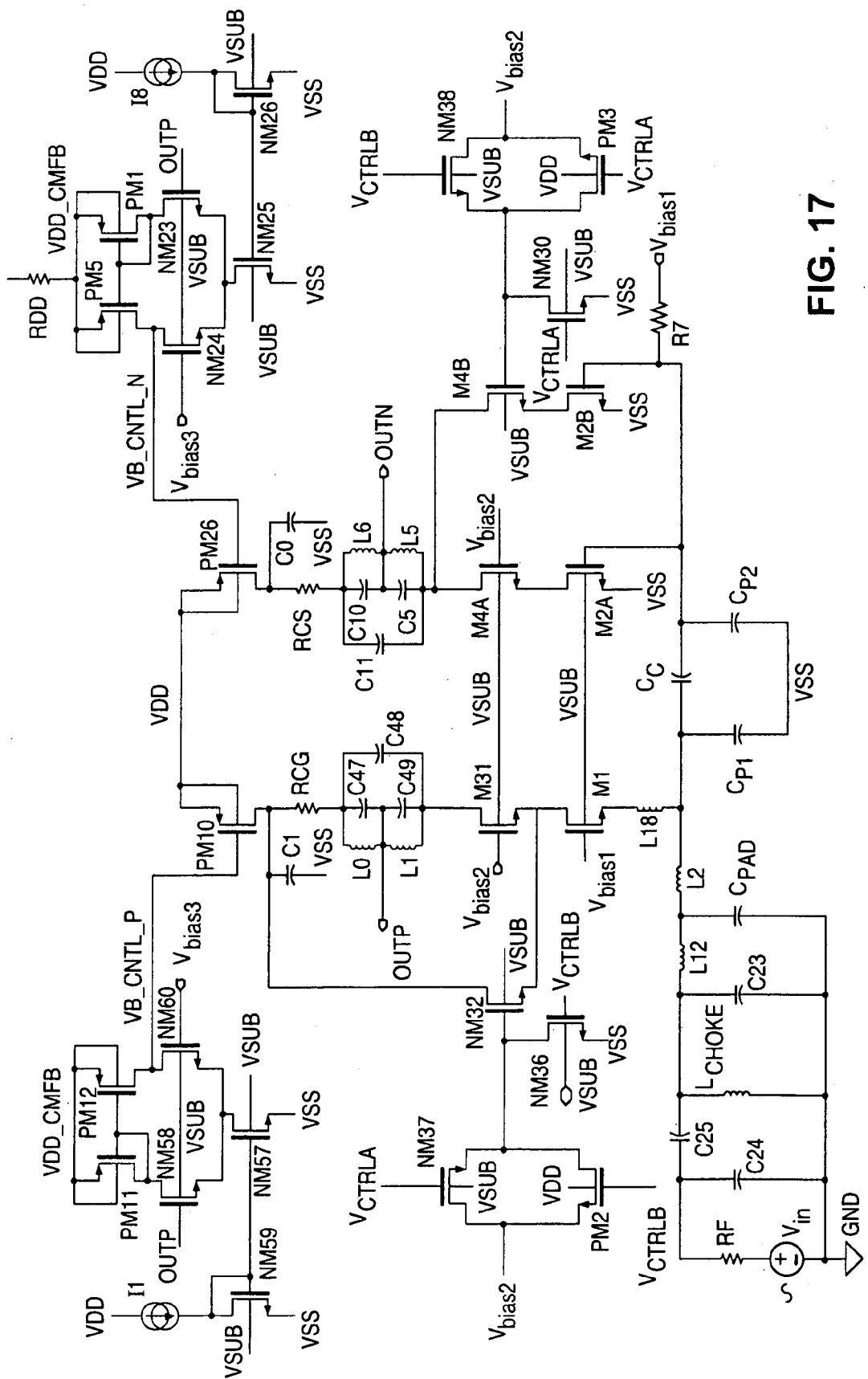
FIG. 17 is an example of a circuit according to another embodiment of the present invention.

FIG. 17 is an example of a circuit according to another embodiment of the present invention. FIG. 17 illustrates how different aspects of the present invention may optionally be combined into a single implementation. The device parameters and component values according to one example embodiment are shown in Table 1 and Table 2 below.

TABLE 1

| Device | Parameters | | Device | Parameters | |
|---|---|---|---|---|---|
| M1 | W = 50 u; | L = 130 n | NM23 | W = 5 u; | L = 130 n |
| M2A | W = 55 u; | L = 130 n | NM24 | W = 5 u; | L = 130 n |
| M2B | W = 88 u; | L = 130 n | NM25 | W = 10 u; | L = 130 n |
| M31 | W = 20 u; | L = 130 n | NM26 | W = 2.5 u; | L = 130 n |
| NM32 | W = 17.5 u; | L = 130 n | PM1 | W = 5 u; | L = 130 n |
| M4A | W = 20 u; | L = 130 n | PM5 | W = 5 u; | L = 130 n |
| M4B | W = 28 u; | L = 130 n | NM57 | W = 10 u; | L = 130 n |
| NM30 | W = 5 u; | L = 130 n | NM58 | W = 5 u; | L = 130 n |
| NM38 | W = 5 u; | L = 130 n | NM59 | W = 2.5 u; | L = 130 n |
| PM3 | W = 15 u; | L = 130 n | NM60 | W = 5 u; | L = 130 n |
| NM36 | W = 5 u; | L = 130 n | PM11 | W = 5 u; | L = 130 n |
| NM37 | W = 5 u; | L = 130 n | PM12 | W = 5 u; | L = 130 n |

TABLE 1-continued

| Device | Parameters | | Device | Parameters |
|---|---|---|---|---|
| PM2 | W = 15 u; | L = 130 n | I8 | 30 uA |
| PM10 | W = 75 u; | L = 700 n | I1 | 30 uA |
| PM26 | W = 200 u; | L = 700 n | | |

TABLE 2

| Component | Values | Component | Values |
|---|---|---|---|
| RF | 50 (equivalent) | C0 | 24.9747p |
| C24 | 50f | C1 | 24.9747p |
| C25 | 10p | RCG | 300 |
| $L_{CHOKE}$ | 15n | RCS | 140 |
| C23 | 150f | L0 | 2n |
| L12 (Package) | 200p | L1 | 2n |
| $C_{PAD}$ | 150f | L5 | 1n |
| L2 | 700p | L6 | 1n |
| L18 | 700p | C47 | 25f |
| $C_C$ | 2.5p | C48 | 20f |
| $C_{P1}$ | 0.4*2.5p | C49 | 25f |
| $C_{P2}$ | 0.4*2.5p | C5 | 25f |
| R7 | 3k | C10 | 20f |
| RDD | 4k | C11 | 25f |

Figure 18:
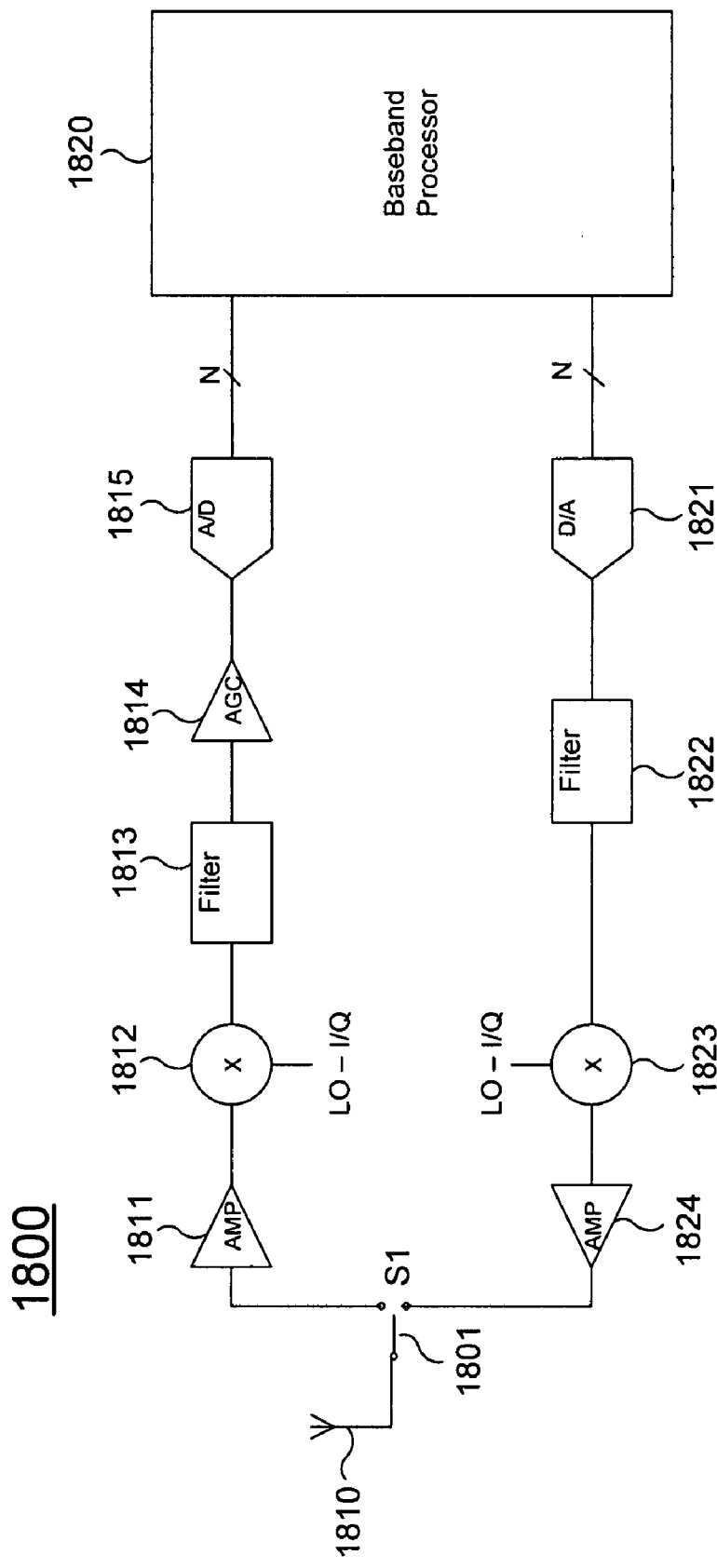
FIG. 18 is an example of a wireless system that may include different embodiments of the present invention.

FIG. 18 is an example of a wireless system that may include different embodiments of the present invention. FIG. 18 is an example of a direct conversion architecture that may use embodiments of the present invention. Wireless system 1800 includes antenna 1810 coupled through a switch 1801 to both a reception channel and a transmission channel. The reception channel includes a low noise amplifier 1811 ("LNA") mixer 1812, filter 1813, automatic gain control 1814 ("AGC") and analog-to-digital converter 1815 ("A/D"). LNA 1811 is used for amplifying high frequency signals from antenna 1810 and must have sufficient bandwidth, gain and noise performance to meet system requirements. The reception channel may include two mixers and parallel paths thereafter for both in phase and quadrature paths (only one path is shown). Mixer 1812 receives a local oscillator signal ("LO-I/Q") at the carrier frequency and demodulates the input signal. In a direct conversion system, the input signal is demodulated down to baseband, and no intermediate frequencies are used. It is to be understood that embodiments of the present invention may be used in either a direct conversion system or a system using intermediate frequencies. Filter 1814 is used to extract the signal of interest from the demodulated signal, and AGC 1814 provides appropriate gain so that the input to A/D 1815 is at the A/D's full range. The output of the reception channel is coupled to baseband processor 1820 over N-bit digital signal lines, for example, for decoding and further processing.

During transmission, baseband processor 1820 encodes a voice or data signal. The encoded signal is received by digital-to-analog converter 1821 ("D/A") as an N-bit digital signal, for example and converted into an analog signal. The output of D/A 1821 is passed through filter 1822 and mixer 1823, which modulates the signal using an input from a local oscillator ("LO-I/Q"). The system may include two transmission paths up to the mixer for both in-phase and quadrature signals (not shown). The modulated signal is received by power amplifier 1824, which amplifies the power in the signal to drive antenna 1810.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A wireless receiver comprising:
    an antenna;
    a first transistor having a source;
    a second transistor having a gate; and
    a network comprising a first terminal coupled to the antenna, a second terminal coupled to the source of the first transistor and a third terminal coupled to the gate of the second transistor,
    wherein the network has a transimpedance between the second and third terminals so that noise generated by the first transistor is differentially rejected across a predetermined range of frequencies.

2. The wireless receiver of claim 1 wherein the input impedance of the first transistor is approximately equal to an equivalent resistance of the antenna.

3. The wireless receiver of claim 1 wherein the transimpedance comprises an equivalent resistance of the antenna.

4. The wireless receiver of claim 1 wherein the network comprises an LC ladder.

5. The wireless receiver of claim 1 wherein the network comprises a first inductor having a first terminal coupled to the source of the first transistor and a second terminal coupled to the gate of the second transistor.

6. The wireless receiver of claim 5 wherein the network further comprises:
    a capacitor having a first terminal coupled to the second terminal of the first inductor and a second terminal coupled to the gate of the second transistor; and
    a second inductor having a first terminal coupled to the first terminal of the capacitor and a second terminal coupled to an integrated circuit pad.

7. The wireless receiver of claim 6 wherein the network further comprises a third inductor coupled between the second terminal of the first inductor and the first terminal of the capacitor.

8. The wireless receiver of claim 1 further comprising:
    a third transistor having a source coupled to the drain of the first transistor, a gate coupled to a first bias voltage and a drain coupled to a first terminal of a first resistor; and
    a fourth transistor having a source coupled to the drain of the second transistor, a gate coupled to a second bias voltage and a drain coupled to a first terminal of a second resistor.

9. The wireless receiver of claim 8 further comprising:
    a first inductor having a first terminal coupled to the drain of the third transistor and a second terminal coupled to the first resistor; and
    a second inductor having a first terminal coupled to the drain of the fourth transistor and a second terminal coupled to the second resistor.

10. The wireless receiver of claim 9 further comprising:
    a third inductor coupled between the first inductor and first resistor;
    a first capacitor coupled across the first and third inductor;
    a fourth inductor coupled between the second inductor and the second resistor; and a second capacitor coupled across the second and fourth inductors.

11. The wireless receiver of claim 8 further comprising a fifth transistor having a source coupled to the drain of the first transistor and a gate controlled by an enable signal, wherein if the enable signal is active the fifth transistor is on, and if the enable signal is inactive the fifth transistor is off.

12. The wireless receiver of claim 8 further comprising:
a fifth transistor having a source coupled to the source of the second transistor, a gate coupled to the gate of the second transistor and a drain;
a sixth transistor having a source coupled to the drain of the fifth transistor, a drain coupled to the drain of the fourth transistor and a gate controlled by an enable signal,
wherein if the enable signal is active the fifth and sixth transistors are turned on, and if the enable signal is inactive the fifth and sixth transistors are off.

13. The wireless receiver of claim 8 further comprising a voltage control circuit having a first input coupled to the first terminal of the first resistor and an output coupled to a second terminal of the first resistor, wherein the voltage control circuit generates a voltage so that a subsequent stage is properly biased.

14. The wireless receiver of claim 8 wherein the first terminal of the first resistor is DC coupled to the gate of a fifth transistor, and wherein the gate of the fifth transistor is coupled to the input of a voltage control circuit comprising:
an amplifier;
a bias generator; and
a controlled impedance.

15. The wireless receiver of claim 1 further comprising a adjustable gain circuit coupled to the first or second transistors.

16. The wireless receiver of claim 1 wherein the first and second transistors are DC coupled to a mixer or amplifier stage.

17. The wireless receiver of claim 1 wherein the second transistor has a transconductance and wherein the product of the transimpedance of the network and the transconductance of the second transistor is approximately equal to the ratio of a first resistor coupled to the drain of the first transistor to a second resistor coupled to the drain of the second transistor across a frequency range of three gigahertz to ten gigahertz.

18. A circuit for receiving high frequency signals across a range of frequencies comprising:
an antenna having an equivalent resistance;
a first transistor having a source coupled to the antenna, a gate coupled to a first bias voltage and a drain, wherein the source input impedance of the first transistor matches the equivalent resistance of the antenna;
a first impedance coupled to the drain of the first transistor;
a second transistor having a source, a gate and a drain, wherein the second transistor has a transconductance during normal operation;
a second impedance coupled to the drain of the second transistor; and
a noise rejection network coupled between the source of the first transistor and the gate of the second transistor, the noise rejection network having a transimpedance between the source of the first transistor and the gate of the second transistor,
wherein the ratio of the first impedance to the second impedance is approximately equal to the product of the transconductance of the second transistor and the transimpedance of the noise rejection network.

19. The circuit of claim 18 wherein the first impedance is approximately equal to the second impedance.

20. The circuit of claim 18 wherein the first impedance is greater than the second impedance.

21. The circuit of claim 18 wherein the noise rejection network comprises the equivalent resistance of the antenna and wherein the transimpedance of the noise rejection network is approximately equal to the equivalent resistance of the antenna.

22. The circuit of claim 18 wherein the noise rejection network comprises the equivalent resistance of the antenna and at least one inductor 23. The circuit of claim 18 wherein the noise rejection network comprises an LC ladder.

24. The circuit of claim 18 wherein the transimpedance of the noise rejection network provides passive gain.

25. The circuit of claim 18 further comprising a adjustable gain circuit coupled to the first or second transistors.

26. The circuit of claim 18 wherein the first and second transistors are DC coupled to a mixer or amplifier stage.

27. An electronic circuit comprising:
a common gate stage having a source input and drain output;
a first resistance coupled to the drain output of the common gate stage;
a common source stage having gate input coupled to the source input of the common gate stage and a drain output, the common source stage having a transconductance;
a second resistance coupled to the drain output of the common source stage; and
a network having a transimpedance coupled between the source input of the common gate stage and gate input of the common source stage,
wherein the product of the transimpedance of the network and the transconductance of the common source stage is approximately equal to the ratio of the first resistance to the second resistance across a range of frequencies above two gigahertz.

28. The circuit of claim 27 wherein the network comprises:
a first inductor having a first terminal coupled to the source of the common gate stage and a second terminal;
a first capacitor having a first terminal coupled to the second terminal of the first inductor and a second terminal coupled to the gate input of the common source stage; and
a second inductor having a first terminal coupled to the second terminal of the first inductor and a second terminal coupled to an antenna.

29. The circuit of claim 28 further comprising:
third and fourth inductors coupled in series between the drain output of the common gate stage and the first resistance;
a second capacitor coupled across the third and fourth inductors;
fifth and sixth inductors coupled in series between the drain output of the common source stage and the second resistance; and
a third capacitor coupled across the fifth and sixth inductors.

* * * * *